US010907092B2

(12) United States Patent
Dong et al.

(10) Patent No.: US 10,907,092 B2
(45) Date of Patent: Feb. 2, 2021

(54) METHODS OF MAKING HIGHLY STABLE PEROVSKITE-POLYMER COMPOSITES AND STRUCTURES USING SAME

(71) Applicants: Yajie Dong, Winter Springs, FL (US); Yanan Wang, Orlando, FL (US); Shin-Tson Wu, Oviedo, FL (US); Juan He, Oviedo, FL (US); Hao Chen, Orlando, FL (US); Jiangshan Chen, Oviedo, FL (US)

(72) Inventors: Yajie Dong, Winter Springs, FL (US); Yanan Wang, Orlando, FL (US); Shin-Tson Wu, Oviedo, FL (US); Juan He, Oviedo, FL (US); Hao Chen, Orlando, FL (US); Jiangshan Chen, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 452 days.

(21) Appl. No.: 15/204,171

(22) Filed: Jul. 7, 2016

(65) Prior Publication Data
US 2018/0010039 A1 Jan. 11, 2018

(51) Int. Cl.
| C09K 11/06 | (2006.01) |
| C09K 11/66 | (2006.01) |
| C09K 11/02 | (2006.01) |
| C08K 5/56 | (2006.01) |

(52) U.S. Cl.
CPC ............... *C09K 11/06* (2013.01); *C08K 5/56* (2013.01); *C09K 11/02* (2013.01); *C09K 11/664* (2013.01); *C09K 2211/10* (2013.01); *C09K 2211/14* (2013.01); *C09K 2211/145* (2013.01); *C09K 2211/1425* (2013.01)

(58) Field of Classification Search
CPC . C09K 11/06; C09K 2211/10; C09K 2211/14; C09K 2211/1425; C09K 2211/145; C08K 5/56
See application file for complete search history.

(56) References Cited

U.S. PATENT DOCUMENTS

2011/0199887 A1* 8/2011 Duerig .................. B82Y 10/00
369/127

FOREIGN PATENT DOCUMENTS

WO 2013/078245 5/2013

OTHER PUBLICATIONS

Masi et al., "Growing perovskite into polymers for easy-processable optoelectronic devices", Scientific Reports, Jan. 21, 2015, pp. 1-7. (Year: 2015).*

Choi et al., "Cesium-doped methylammonium lead iodide perovskite light absorber for hybrid solar cells", May 6, 2014, Nano Energy, vol. 7, pp. 80-85. (Year: 2014).*
Protesescu et al., "Nanocrystals of Cesium Lead Halide Perovskites (CsPbX3, X=Cl, Br and I): Novel Optoelectronic Materials Showing Bright Emission with Wide Color Gamut", Jan. 29, 2015, Nanoletters, 15, pp. 3692-3696. (Year: 2015).*
Groff et al., "Supporting Information for Effect of Solvent-Induced Swelling on Exciton Transport in Conjugated Polymer Nanoparticles", Mar. 15, 2017, J. Phys.Chem. C, 121, pp. 7549-7557 (Year: 2017).*
Kulbak et al., "Cesium Enhances Long-Term Stability of Lead Bromide Perovskite-Based Solar Cells", The Journal of Physical Chemistry Letters, pp. 167-171. (Year: 2015).*
Ren et al., "Thermal Assisted Oxygen Annealing for High Efficiency Planar CH3NH3PbI3 Perovskite Solar Cells", Scientific Reports, 4:6752, pp. 1-6. (Year: 2014).*
Martinez-Sarti et al., "Efficient photoluminescent thin films consisting of anchored hybrid perovskite nanoparticles", Chem. Commun. , 52, pp. 11351-11354. (Year: 2016).*
Bai, Young, et al., High performance inverted structure perovskite solar cells based on a PCBM:polystyrene blend electron transport layer. Chem. Mater.3, 9098-9102 (2015).
Berry, J. et al. Hybrid organic—inorganic perovskites (HOIPs): opportunities and challenges. Adv. Mater. 27, 5102-5112 (2015).
Chen, J. et al. Quantum Dots: Optimizing LCD Systems to Achieve Rec. 2020 Color Performance, SID Symp. Dig. Tech. Pap. 46, 173-175 (2015).
Cho, H. et al. Overcoming the electroluminescence efficiency limitations of perovskite light-emitting diodes. Science 350, 1222-1225 (2015).
Conings, B. et al. Intrinsic thermal instability of methylammonium lead trihalide perovskite. Adv. Energy Mater. 5, 1-8 (2015).
DeQuilettes, D. W. et al. Impact of microstructure on local carrier lifetime in perovskite solar cells. Science 348, 683-686, (2015).
Di, Dawei, et al. Size-dependent photon emission from organometal halide perovskite nanocrystals embedded in an organic matrix. J. Phys. Chem. Lett. 6 446-450 (2015).
Dong, Y., et al. Emerging solution-processable luminescent nanomaterials in hybrid structures offer new solutions for displays and lighting. *Info. Display* 6-14 (2017).
Dong, Y. Invited Paper: solution processable luminescent nanomaterials for display, lighting and beyond. *Research Gate* 1-3 (2017).
Erman, B. & Flory, P. Critical phenomena and transitions in swollen polymer networks and in linear macromolecules. Macromolecules 19, 2342-2353 (1986).
Green, M. A., Ho-Baillie, A. & Snaith, H. J. The emergence of perovskite solar cells. Nature Photon. 8, 506-514 (2014).
(Continued)

*Primary Examiner* — Matthew E. Hoban
*Assistant Examiner* — Lynne Edmondson
(74) *Attorney, Agent, or Firm* — Timothy H. Van Dyke; Wolter Van Dyke; Davis, PLLC

(57) ABSTRACT

Methods of making luminescent perovskite-polymer composites are provided and structures using the same. Perovskite-polymer composites made by the method described herein are provided. The perovskite-polymer composite is useful in many applications including downconverters for backlight units (BLU) of liquid crystal displays (LCDs), as well as for and could be used for light emitting devices, lasers or as active absorber or passive luminescent concentrators for solar photovoltaic applications.

7 Claims, 12 Drawing Sheets

(56) References Cited

OTHER PUBLICATIONS

Guarnera, S. et al. Improving the long-term stability of perovskite solar cells with a porous Al2O3 buffer layer. J. Phys. Chem. Lett. 6, 432-437 (2015).
Gou, Y. et al. Air-Stable and Solution-Processable perovskite photodetectors for solar-blind UV and visible light. Research Gate. 1-4 (2015).
Habisreutinger, S. N. et al. Carbon nanotube/polymer composites as a highly stable hole collection layer in perovskite solar cells. Nano lett. 14, 5561-5568 (2014).
Hauff, V. E., Lira Cantu, M., Brown, T. M. & Hoppe, H. Emerging Thin film photovoltaics: stabilize or perish. Adv. Energy Mater. 5 (2015).
Jeon, N. et al. Solvent engineering for high-performance inoragnic-organic hybrid perovskite solar cells. Nature Mater. 13, 897-903 (2014).
Kaman, O. et al. Silica encapsulated manganese perovskite nanoparticles for magnetically induced hyperthermia without. Nanotechnology. 1-10 (2009).
Lee, M., Teuscher, J., Miyasaka, T., Murakami, T. & Snaith, H. Organometal halide perovskites efficient hybrid solar cells based on meso-superstructure Science 338, 643-647 (2012).
Leijtens, T. et al. Stability of metal halide perovskite solar cells. Adv.Energy Mater. 5 (2015).
Li, M., et al. Microencapsulation by solvent exaporation: state of the art for process engineering approaches. Internat. Journ. Pharm. 363, 26-39 (2008).
Longo, G., Pertegás, A., Martinez-Sarti, L., Sessolo, M. & Bolink, H. J. Highly luminescent perovskite—aluminum oxide composites. J. Mater. Chem. C 3, 11286-11289 (2015).
Loo, L. & Patel, P. Perovskite photovoltaics: David Mitzi addresses the promises and challenges. MRS Bull. 40, 636-637 (2015).
Luo, Z., Xu, D. & Wu, S.-T. Emerging quantum-dots-enhanced LCDs. J. Display Technol. 10, 987-990 (2014).
Marion, Ingle. Permeability properties of plastics and elastomers. Mater. World. 52 (2012).
Masi, S., et al. Growing perovskite into polymers for easy-processable optoelctronic devices. Scien. Reports 1-7 (2015).
Pathak, S. et al. Perovskite crystals for tunable white light emission. Chem.Mater. 27, 8066-8075 (2015).
Schmidt, L. C. et al. Nontemplate synthesis of $CH_3NH_3PbBr_3$ perovskite nanoparticles. J. Am. Chem. Soc. 136, 850-853 (2014).
Sheng, R. et al. Photoluminescence characterisations of a dynamic aging process of organic—inorganic $CH_3NH_3PbBr_3$ perovskite. Nanoscale 8, 1926-1931 (2016).
Shi, D. et al. Low trap-state density and long carrier diffusion in organolead trihalide perovskite single crystals. Science 347, 519-522 (2015).
Steckel, J. S. et al. Quantum dots: The ultimate down-conversion material for LCD displays. J. Soc. Inf. Display 23, 294-305 (2015).
Stranks, S. D. & Snaith, H. J. Metal-halide perovskites for photovoltaic and light-emitting devices. Nature Nanotech. 10, 391-402 (2015).
Tan, Z.-K. et al. Bright light-emitting diodes based on organometal halide perovskite. Nature Nanotech. 9, 687-692 (2014).
Wang, Y. et al. Ultrastable highly luminescent organic-inorganic perovskite-polymer composite films. Materials Views. 28, 10710-10717 (2016).
Xing, G. et al. Low-temperature solution-processed wavelength-tunable perovskites for lasing. Nature. Mater. 13, 476-480 (2014).
Yang, W. S. et al. High-performance photovoltaic perovskite layers fabricated through intramolecular exchange. Science 348, 1234-1237 (2015).
You, J., et al. Moisture assisted perovskite film growth for high performance solar cells. App. Phys. Lett. 105, 1-5 (2014).
Zhang, F. et al. Brightly luminescent and color-tunable colloidal $CH_3NH_3PbX_3$ (X=Br, I, Cl) quantum dots: potential alternatives for display technology. ACS nano 9, 4533-4542 (2015).
Zhu, F. et al. Shape evolution and single particle luminescence of organometal halide perovskite nanocrystals. ACS Nano 9, 2948-2959 (2015).
Zhu, R., Luo, Z., Chen, H., Dong, Y. & Wu, S.-T. Realizing Rec. 2020 color gamut with quantum dot displays. Optics express 23, 23680-23693 (2015).
International Search Report and Written Opinion for PCT Application PCT/US17/040702 dated Dec. 26, 2017, pp. 1-13.

\* cited by examiner

METHODS OF MAKING HIGHLY STABLE PEROVSKITE-POLYMER COMPOSITES AND STRUCTURES USING SAME

STATEMENT OF GOVERNMENT INTEREST

This invention was made with Government support under contract No. FA9440-14-1-0279 awarded by Air Force Office of Scientific Research. The Government has certain rights in the invention.

BACKGROUND

Solution processable perovskites have recently been established as an important class of photovoltaic materials and they have also emerged as promising light emitting materials with high efficiency and superior color purity. But perovskites suffer from significant moisture sensitivity and poor long term stability issues. Despite the progress of these perovskites for photovoltaic and light emitting applications, their instability under external stresses (i.e., heat, water, light, and electrical field) remains one of the biggest challenges before perovskites can be manufactured as low cost, highly reliable, high performance photovoltaic or light emitting materials.

The instabilities of perovskites are often attributed to their low formation energy (~0.1-0.3 eV), which makes it easy for them to be conveniently solution processed, but also renders them vulnerable to the external stresses. In the presence of moisture and oxygen, perovskite grains grow spontaneously even at room temperature, leading to a higher density of defects and a shorter carrier lifetime. Three passivation strategies have been developed to stabilize perovskites, but only with limited success. One commonly used approach involves film formation through impregnation of a pre-formed mesoporous inorganic matrix (such as $TiO_2$ or $Al_2O_3$) with the perovskite precursor solutions. However, the solvent evaporation from pre-formed, thus static, inorganic porous structures will inevitably lead to partially exposed, unprotected perovskites. In fact, significant decomposition already occurs during annealing of perovskites on porous $TiO_2$ at 85° C. even in inert atmosphere. Further coverage of these perovskites films with carbon nanotube/polymer composite demonstrated impressive "water resistant" devices, but such macroscale passivation leaves perovskites vulnerable to potential attacks due to film leakage. The second strategy, solution based synthesis of surfactant-protected perovskite nanoparticles, can achieve passivation of individual nanocrystal grains and lead to colloidal perovskites with enhanced stability and photoluminescent quantum yield (PLQY). However, when the perovskite nanoparticles are processed as thin films, their efficiency tends to substantially reduce because of quenching induced by spontaneous particle aggregations. The third strategy involves deposition of composite films from mixtures of perovskite precursors with protecting media, such as organic small molecules, polymers or inorganic nanoparticles. Although inherently simple, this approach often resulted in serious phase separation between perovskites and their protecting media, leading to large perovskite grain size variation, broad PL peaks, lower PLQY and unsatisfactory protection.

In view of perovskites' moisture sensitivity and instability, there is a need for stable, highly luminescent perovskite-polymer composites with exceptional moisture sensitivity and longer term stability.

SUMMARY

It has been discovered that the use of a swelling-deswelling microencapsulation process in the creation of a perovskite-polymer composite provides for highly stable, highly luminescent composites that have great dispersion and passivation of crystalline perovskite nanoparticles within a polymer matrix.

In certain embodiments, methods of making these highly stable perovskite-polymer composites are provided. First, perovskite precursors in solution are prepared and are contacted with a polymer matrix. The contacting is in the presence of a solvent. A solvent-induced polymer swelling-deswelling process is created where the solvent penetrates polymer in the polymer matrix causing swelling and entry of perovskite precursors into the polymer. The solvent is removed from the polymer matrix leaving the perovskite precursors in the polymer matrix to react and form perovskite nanocrystals. The polymer subsequently deswells forming a barrier layer around the perovskite nanocrystals to create a stable perovskite-polymer composite.

The perovskite precursor solution comprising $PbX_2$ and $RNH_3X$ to yield $RNH3PbX_3$ is in solvent in certain embodiments and is processed onto the polymer matrix using a process selected from the group consisting of spin coating, dip coating, slot die coating, ink jet coating, spray coating and cotton swab painting. The perovskite precursor solution may be an inorganic mixture comprising $PbX_2$ and $CsX$ to yield $CsPbX_3$ in solvent.

In certain embodiments, solvents are selected from the group consisting of dimethylformamide (DMF), dimethyl sulfoxide (DMSO), r-butyrolactone (GBL), acetone, and acetonitrile. The solvent may be removed by baking at 25-120 degrees Celsius.

In other embodiments, the polymer is selected from the group consisting of polystyrene (PS), polycarbonate (PC), cellulose acetate (CA), polyvinal chloride (PVC), poly (vinylidene fluoride), (PVDF), polyurea (PU), poly (methyl methacrylate) (PMMA), polyvinyl alcohol (PVA), and polynitriles.

Perovskite-polymer composites made by the methods described herein are provided in certain embodiments. The perovskite-polymer composite made by the methods described herein may be used in downconverters for backlight units (BLU) of liquid crystal displays (LCDs), as well as for and could be used for light emitting devices, lasers or as active absorber or passive luminescent concentrators for solar photovoltaic applications. The polymer is one or a combination selected from the group consisting of polystyrene (PS), polycarbonate (PC), cellulose acetate (CA), polyvinyl chloride (PVC), poly (vinylidene fluoride), (PVDF), polyurea (PU), poly (methyl methacrylate) (PMMA), polyvinyl alcohol (PVA), and polynitriles. In other embodiments, a perovskite-polymer composite is comprised of perovskite nanocrystals having a polymer coating via passivation. The polymer coating serves as a barrier layer around the perovskite nanocrystals to create the protection from environmental stresses (e.g., heat, moisture, cold). The perovskite-polymer composite is water resistant for at least two months, and thermally stable from 100 degrees Celsius to about 200 degrees Celsius. They may also possess high photoluminescence quantum yield (PLQY), up to 15-65%, high color purity showing full width at half maxima (FWHM) down to 18-25 nm, and long average radiative lifetime ($\tau_{avg}$) up to 130-502 ns.

These and other features, aspects, and advantages of the present invention will become better understood with regard to the following description, appended claims, and accompanying figures.

BRIEF DESCRIPTION OF THE DRAWINGS

The following drawings form part of the present specification and are included to further demonstrate certain embodiments of the present invention. The invention may be better understood by reference to one or more of these drawings in combination with the detailed description of specific embodiments presented herein.

FIG. 1A is a schematic illustrating a MAPbBr$_3$-polymer composite formation process through swelling-deswelling. FIG. 1B-1C show images of the luminescent composite samples prepared by cotton swab painting (1B) or spin coating (1C) under UV excitation (365 nm). Samples from left to right are MAPbBr$_3$-PS, MAPbBr$_3$-PC, MAPbBr$_3$-ABS, MAPbBr$_3$-CA, MAPbBr$_3$-PVC and MAPbBr$_3$-PMMA respectively. In FIG. 1D, fluorescent optical microscope images of MAPbBr$_3$-PS composite with focal plane ~4 μm underneath the top surface are shown. FIG. 1E-1F illustrate scanning electron microscopy (SEM) images of a PS surface before (1E) and after (1F) MAPbBr$_3$ spin coating and substrate annealing processing. In FIG. 1G, a cross-section transmission electron microscopy (TEM) image of MAPbBr$_3$-PS composites showing well dispersed MAPbBr$_3$ nanoparticles embedded in PS is shown. Inset: HRTEM of single MAPbBr$_3$ nanoparticle. In FIG. 1H, HRTEM of highlighted area as in FIG. 1G, Inset: fast Fourier transform (FFT) of FIG. 1H.

In FIG. 2A-2F, UV-Vis absorption (red) and PL emission (green) spectra are shown. In FIG. 2G-2L, PL decay (green) and fitting curves (red) for excitation at 467 nm and emission at ~530 nm of various MAPbBr$_3$-polymer composites are illustrated. The samples from top to bottom are MAPbBr$_3$-PS (FIG. 2A, 2G), MAPbBr$_3$-PC (FIG. 2B, 2H), MAPbBr$_3$-ABS (FIG. 2C, 2I), MAPbBr$_3$-CA (FIG. 2D, 2J), MAPbBr$_3$-PVC (FIG. 2E, 2K) and MAPbBr$_3$-PMMA (FIG. 2F, 2L).

In FIG. 3A, photographs taken under white light or UV irradiation at indicated time period are shown. The composite samples immersed in water are CH$_3$NH$_3$PbBr$_3$-PS, CH$_3$NH$_3$PbBr$_3$-PC, CH$_3$NH$_3$PbBr$_3$-ABS, CH$_3$NH$_3$PbBr$_3$-PVC, CH$_3$NH$_3$PbBr$_3$-CA and CH$_3$NH$_3$PbBr$_3$-PMMA. In FIG. 3B-3D, temperature-dependent PL intensity of composites CH$_3$NH$_3$PbBr$_3$-PS (FIG. 3B), CH$_3$NH$_3$PbBr$_3$-PC (FIG. 3C) and CH$_3$NH$_3$PbBr$_3$-ABS (FIG. 3D) are shown in representative graphs. Squares mark the first thermal cycle and triangles represent the second thermal cycle. The solid symbols refer to heating stages and open symbols to cooling stages. Black lines in (FIG. 3B) and (FIG. 3C) indicate Boltzmann fittings for the reversible heating, cooling processes.

FIG. 4A is a photograph of red QD-PC and MAPbBr$_3$-PC composite films under UV illumination. FIG. 4B is a schematic of white light generation by integrating red QD-PC and MAPbBr$_3$-PC films with blue light emitting diodes. FIG. 4C is a graph illustrating emission spectra of a white LED system with green MAPbBr$_3$-PC and red QD-PC films as down converters for blue LEDs. Dash lines refer to gaussian fit for green and red emission spectra. In FIG. 4D, color gamut coverage of the white LED systems (blue) with adobe RGB (gray) and Rec. 2020 (black) standards for comparison in CIE 1931 is shown.

FIG. 5A, MAPbBr$_3$-PC. FIG. 5B, MAPbBr$_3$-ABS. FIG. 5C, MAPbBr$_3$-CA. FIG. 5D, MAPbBr$_3$-PVC. FIG. 5E, MAPbBr$_3$-PMMA. For FIG. 5A-5D, the image focal planes were ~4-5 μm deep underneath the top surface of the samples. For FIG. 5E, the focal plane was on the top surface.

FIG. 6A, PC. FIG. 6B, MAPbBr$_3$-PC. FIG. 6C, ABS. FIG. 6D, MAPbBr$_3$-ABS. FIG. 6E, CA. FIG. 6F, MAPbBr$_3$-CA. FIG. 6G, PVC. FIG. 6H, MAPbBr$_3$-PVC. FIG. 6I, PMMA. FIG. 6J, MAPBBr$_3$-PMMA.

FIG. 7A, EDS spectra were taken from highlighted region of the MAPbBr$_3$-PS composites, and showed the existence of element Pb and Br. FIG. 7B, Table B showing the Pb and Br atomic ratio.

FIG. 8A, MAPbBr$_3$-PS. FIG. 8B, MAPbBr$_3$-PC. FIG. 8C, MAPbBr$_3$-ABS. For each figure, squares mark the first thermal cycle and triangles represent the second thermal cycle. The solid symbols refer to heating and open symbols to cooling.

FIG. 9A, MAPbBr$_3$-PS. FIG. 9B, MAPbBr$_3$-PC. FIG. 9C, MAPbBr$_3$-ABS. The red curves were measured when the samples cooled to room temperature from the second thermal cycle.

FIG. 10A, FIG. 10B, Fluorescent optical microscope image of MAPbBr$_3$-PS (FIG. 10A) and MAPbBr$_3$-PC (FIG. 10B) after boiling in water. FIG. 10C, FIG. 10D PL spectra of MAPbBr$_3$-PS (FIG. 10C) and MAPbBr$_3$-PC (FIG. 10D) before and after water boiling. $I_0$ refers to the initial PL peak intensity before water boiling. FIG. 10E, FIG. 10F, UV-Vis spectra of MAPbBr$_3$-PS (FIG. 10E) and MAPbBr$_3$-PC (FIG. 10F) before (green) and after (red) water boiling.

FIG. 11A, MAPbBr$_3$-PS. FIG. 11B, MAPbBr$_3$-PC. FIG. 11C, MAPbBr$_3$-ABS. FIG. 11D, MAPbBr$_3$-CA. FIG. 11E, MAPbBr$_3$-PVC. FIG. 11F, MAPbBr$_3$-PMMA.

DETAILED DESCRIPTION

1. Introduction

Figures 1A, 1B, 1C, 1D, 1E, 1F, 1G, 1H:
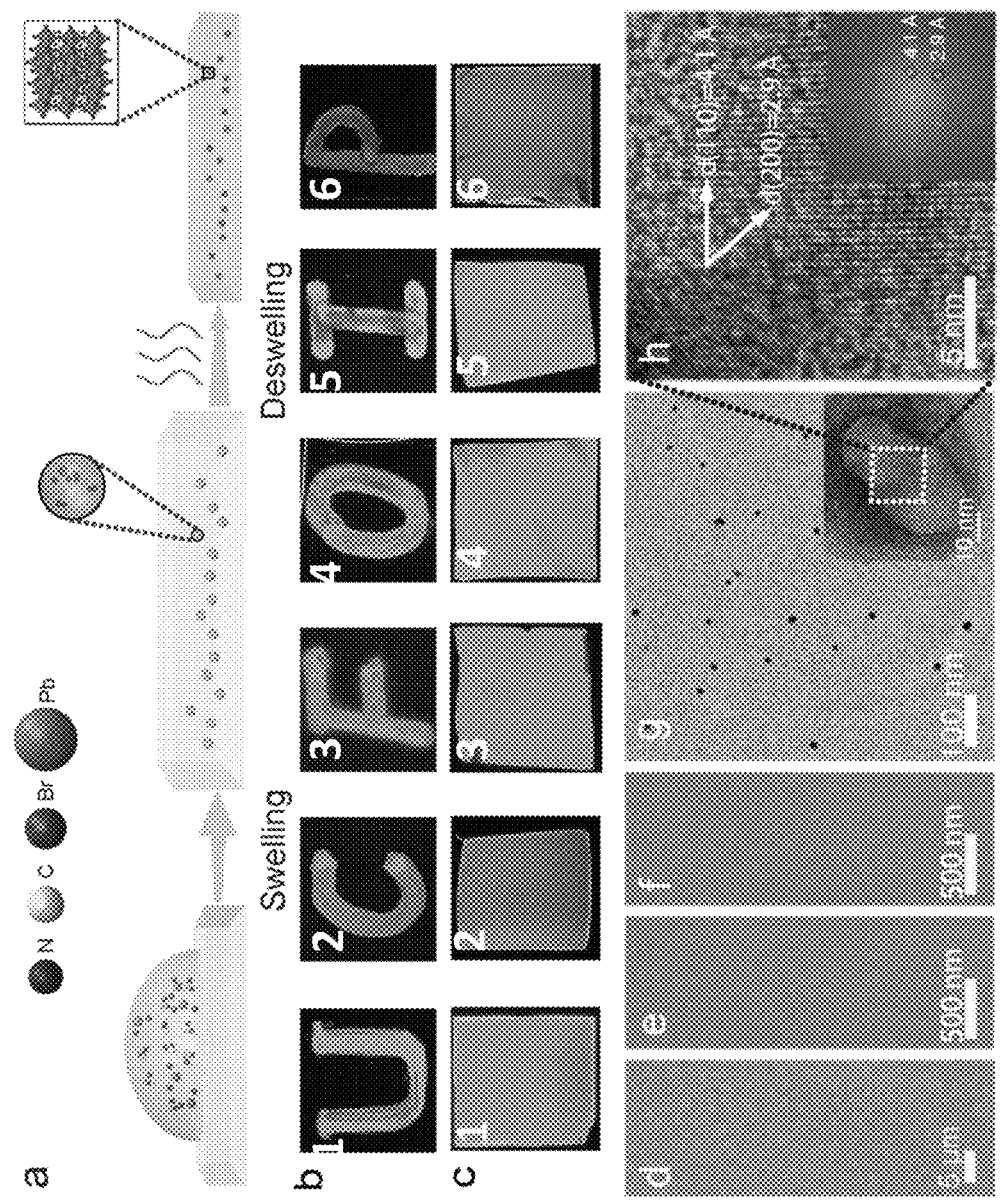
FIG. 1A-1H. Swelling-deswelling microencapsulation strategy to perovskite-polymer composites.

It has been discovered that a series of highly stable, highly luminescent CH$_3$NH$_3$PbBr$_3$ (MAPbBr$_3$)-polymer composites can be fabricated through a swelling-deswelling microencapsulation process. As a result, dispersion and passivation of crystalline perovskite nanoparticles within polymer matrix have been achieved. These composites possess high photoluminescence quantum yield (PLQY), up to 15-65%, high color purity showing full width at half maxima (FWHM) down to 18-25 nm, and long average radiative lifetime ($\tau_{avg}$) up to ~130-502 ns.

The perovskite-polymer composites in the present invention demonstrate water resistance and heat stability. Among them, MAPbBr$_3$-polystyrene (PS) and MAPbBr$_3$-polycarbonate (PC) composites can survive boiling water treatment with minimum degradations. PLQY characterizations after boiling the samples for 30 minutes showed decay of only less than 7% for MAPbBr$_3$-PC and 15% for MAPbBr$_3$-PS composites. Using these green emissive MAPbBr$_3$-polymer composites and red CdSe based quantum dots as down-converters of blue LEDs, high color quality white-light generation were demonstrated, providing color gamut coverage of record high 95% of Rec 2020, the color standard for ultra-high definition (UHD) TVs. This method enables the use of perovskites in various applications as back light down converters for liquid crystal display, and may lead to solution processed highly stable, color pure light emitting devices, lasers or even high efficiency solar photovoltaics.

In the following description, for the purposes of explanation, numerous specific details are set forth in order to provide a thorough understanding of the present invention. It will be apparent, however, to one skilled in the art that the present invention may be practiced without these specific details. In order that the invention may be readily understood and put into practical effect, particular preferred embodiments will now be described by way of the following non-limiting examples.

2. Definitions

Unless otherwise defined, all technical and scientific terms used herein are intended to have the same meaning as commonly understood in the art to which this invention pertains and at the time of its filing. Although various methods and materials similar or equivalent to those described herein can be used in the practice or testing of the present invention, suitable methods and materials are described below. However, the skilled should understand that the methods and materials used and described are examples and may not be the only ones suitable for use in the invention. Moreover, it should also be understood that as measurements are subject to inherent variability, any temperature, weight, volume, time interval, pH, salinity, molarity or molality, range, concentration and any other measurements, quantities or numerical expressions given herein are intended to be approximate and not exact or critical figures unless expressly stated to the contrary. Hence, where appropriate to the invention and as understood by those of skill in the art, it is proper to describe the various aspects of the invention using approximate or relative terms and terms of degree commonly employed in patent applications, such as: so dimensioned, about, approximately, substantially, essentially, consisting essentially of, comprising, and effective amount.

The term, "perovskite" as used herein, means a crystal structure with the structural formula ABX$_3$, where A, B, and X are organic and inorganic ions, respectively. By replacing the inorganic A cation with an organic cation, an organic-inorganic perovskite (OIP) can be formed. In certain embodiments, A is an organic or inorganic cation, B is a metal cation, and X is at least one anion. The cation A may be selected from the organic group consisting of RNH3 where R is unsubstituted or substituted $C_1$-$C_{20}$ alkyl or inorganic group wherein A is Cs+ B may be a divalent metal cation selected from the group consisting of Ca2+, Sr2+, Cd2+, Cu2+, Ni2+, Mn2+, Fe2+, Co2+, Pd2+, Ge2+, Sn2+, Pb2+, Sn2+, Yb2+, and Eu2, preferably Pb2+, Sn2+, Ge2+, more preferably Pb2+. X may be one or more different halide anions selected from the group consisting of fluoride (F$^-$), chloride (Cl$^-$), bromide (Br$^-$), iodide (I$^-$), preferably, Br–. The general chemical formula for perovskite compounds is ABX$_3$, where 'A' and 'B' are two cations of very different sizes, and X is an anion that bonds to both. The 'A' atoms are larger than the 'B' atoms.

Figure 12:
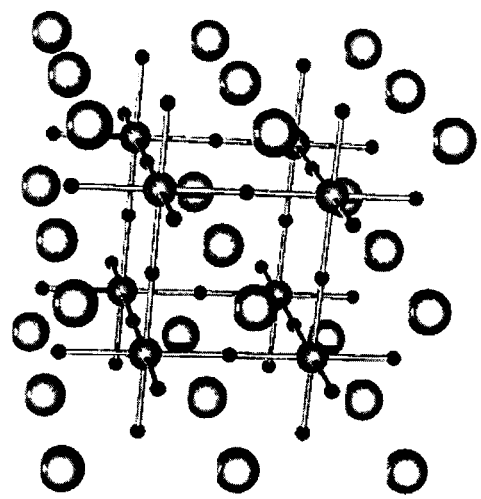
FIG. 12. Perovskite structure, the red spheres are X atoms (usually oxygens), the blue spheres are B-atoms (a smaller metal cation, such as Ti$^{4+}$), and the green spheres are the A-atoms (a larger metal cation, such as Ca$^{2+}$).

(Adapted from Wikipedia) In the perovskite structure, the red spheres are X atoms (usually oxygens), the blue spheres are B-atoms (a smaller metal cation, such as Ti$^{4+}$), and the green spheres are the A-atoms (a larger metal cation, such as Ca$^{2+}$). See FIG. 12.

Figure 13:
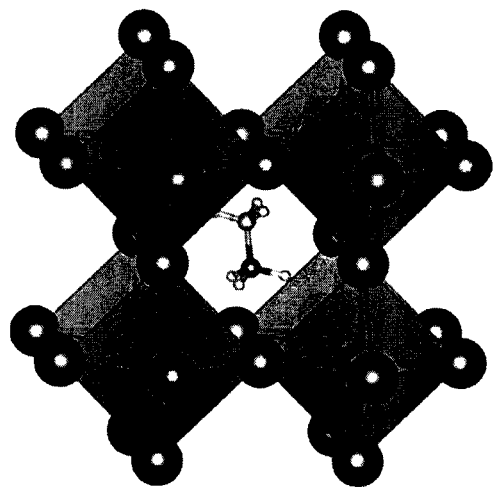
FIG. 13. Crystal structure of CH$_3$NH$_3$PbX$_3$ perovskites (X=I, Br and/or Cl). The methylammonium cation (CH$_3$NH$_3$+) is surrounded by PbX$_6$ octahedra

In preferred embodiments, methylammonium lead trihalide (CH$_3$NH$_3$PbX$_3$, where X is a halogen atom such as iodine, bromine or chlorine), with an optical bandgap between 1.5 and 2.8 eV depending on halide content is used. (Adapted from Wikipedia). Crystal structure of CH$_3$NH$_3$PbX$_3$ perovskites (X=I, Br and/or Cl). The methylammonium cation (CH$_3$NH$_3$+) is surrounded by PbX$_6$ octahedra. See FIG. 13

The term, "polymer" as used herein, means a large molecule, or macromolecule, composed of many repeated subunits. Polymers, both natural and synthetic, are created via polymerization of many small molecules, known as monomers. Their consequently large molecular mass relative to small molecule compounds produces unique physical properties, including toughness, viscoelasticity, and a tendency to form glasses and semicrystalline structures rather than crystals. In certain embodiments, polymers may be selected from the group consisting of polystyrene (PS), polycarbonate (PC), cellulose acetate (CA), polyvinal chloride (PVC), poly (vinylidene fluoride), (PVDF), polyurea (PU), poly (methyl methacrylate) (PMMA), polyvinyl alcohol (PVA), and polynitriles.

The term, "spin coating" as used herein, means a procedure used to deposit uniform thin films to flat substrates. Usually a small amount of coating material is applied on the center of the substrate, which is either spinning at high or low speed or not spinning at all.

The term "dip coating" as used herein, means immersing of a substrate into a tank containing coating material, removing the piece from the tank, and allowing it to drain. The coated piece can then be dried by force-drying or baking. It is a popular way of creating thin film coated materials along with the spin coating procedure. The dip coating process can be, generally, separated into 3 stages: Immersion: the substrate is immersed in the solution of the coating material at a constant speed preferably judder free Dwell time: the substrate remains fully immersed and motionless to allow for the coating material to apply itself to the substrate Withdrawal: the substrate is withdrawn, again at a constant speed to avoid any judders. The faster the substrate is withdrawn from the tank the thicker the coating material that will be applied to the board.

The term "slot die coating" as used herein, means a technology used to deposit a variety of liquid chemistries onto glass, stainless steel, and plastic substrates. This is achieved through the precise metering the process fluid and dispensing it at a controlled rate while the coating die is precisely moved relative to the substrate.

The term "ink jet coating" is an emerging manufacturing technique in which ink jet technology is used to deposit materials on substrates. The technique aims to eliminate fixed costs of production and reduce the amount of materials used.

The term, "passivation," as used herein, means the use of a light coat of a protective material, such as metal oxide, to create a shell or coating.

The term, "substrate" as used herein, means a substance or layer that underlies something, or on which some process occurs. The term, "polymer substrate" as used herein, means a polymer layer that underlies a perovskite solution.

The term, "solvent" as used herein, means the liquid in which a solute is dissolved to form a solution. In certain embodiments, solvents dissolve perovskites (e.g., dimethylformamide (DMF), dimethyl sulfoxide (DMSO), r-butyrolactone (GBL), acetone, and acetonitrile).

3. Overview

The present invention relates to providing a general method to fabricate stable, highly luminescent perovskite-polymer composites and their application either as optical down-converters or emitters for display and lighting, or as active absorber or passive luminescent concentrators for solar photovoltaics.

The swelling-deswelling encapsulation method involves three components: (i) perovskite precursors; (ii) solvents, and (iii) polymer substrates that swell when brought into contact with the solvents and deswell when the solvents were removed. In certain embodiments, the typical fabrication process is illustrated in FIG. 1A. First, a perovskite-precursor solution is prepared. In certain embodiments, $PbBr_2$ and $CH_3NH_3Br$ are combined with molar ratio of 1:3 in dimethylformamide to yield $MAPbBr_3$. In other embodiments, the solution is inorganic and comprises $PbX_2$ and CsX to yield $CsPbX_3$. Second, the perovskite-precursor solution is processed directly onto a polymer matrix through spin coating, dip coating, slot die coating, ink jet printing, spray coating or cotton swab painting. Third, a solvent (e.g., dimethylformamide) penetrates the polymers, causes them to swell, and as a result, brings the perovskite precursors into the swelled polymers. Finally, the solvent is driven out of the polymer matrix (e.g., by baking at temperatures ranging from 25-120 degrees Celsius for 2-10 hours), leaving the perovskite-precursors within the polymer matrix to react and form high quality, well dispersed luminescent perovskite nanocrystals. Meanwhile, the polymer substrate deswells, or shrinks back, and forms a coherent barrier layer around the perovskite nanocrystals. This barrier protects them from water and oxygen from the surrounding environment. The perovskite-polymer composites possess high optical qualities showing narrow emission peaks and high photoluminescence quantum yield (PLQY) and environmental stabilities because of the coherent encapsulation by polymer barrier layers.

Numerous types of perovskites, solvents, and polymers may be used as long as the polymers swell and deswell when solvents enter and exit them. For example, perovskites have the formula of $ABX_3$, in which A is an organic or inorganic cation. B is a metal cation, and X is at least one anion. The cation A may be selected from the organic group consisting of $RNH_3$ where R is unsubstituted or substituted C1-C20 alkyl or inorganic ion wherein A is $Cs+$. B may be a divalent metal cation selected from the group consisting of $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$, and $Eu2$, preferably $Pb^{2+}$, $Sn^{2+}$, $Ge^{2+}$, more preferably $Pb^{2+}$. X may be one or more different halide anions selected from the group consisting of fluoride (F−), chloride (Cl−), bromide (Br−) and iodide (I−), preferably, Br−. Solvents are readily available in the art and dissolve perovskites (e.g., dimethylformamide (DMF), dimethyl sulfoxide (DMSO), r-butyrolactone (GBL), acetone, and acetonitrile). Polymers that swell and dissolve and deswell in the solvents described herein may be selected from the group consisting of polystyrene (PS), polycarbonate (PC), cellulose acetate (CA), polyvinal chloride (PVC), poly (vinylidene fluoride), (PVDF), polyurea (PU), poly (methyl methacrylate) (PMMA), polyvinyl alcohol (PVA), and polynitriles.

4. Detailed Description of the Embodiments

Here we report a swelling-deswelling microencapsulation strategy to achieve well dispersed, intimately passivated perovskite nanoparticles inside polymer matrixes and show that as-obtained perovskite-polymer composites have high photoluminescence efficiency, color purity and ultrahigh stability against heat and water attacks. Accordingly, it is an object of the present invention to provide novel semiconducting or insulating perovskite-polymer composites. It is another object of the present invention to provide low-cost, easily processed perovskite-polymer composites, which can be used as materials in flat panel displays, non-linear optical/photoconductive devices, chemical sensors, emitting and charge transporting layers in light-emitting diodes, solar cells and as channel layers in field-effect transistors. It is a further object of the present invention to provide simple and cost-effective methods of preparing the novel perovskite-polymer composites.

These and other objects of the present invention will become apparent by the novel perovskite-polymer composites and the methods of preparing the perovskite-polymer composites.

A. Methods of Making Perovskite-Polymer Composites

Perovskites are a large family of compounds that share the same chemical formula $ABX_3$. 'A' and 'B' denote cations, where A is much larger than B, and 'X' an anion. The versatility of perovskites makes them highly attractive as they can form multidimensional structures pertaining to the same chemical formula through use of different combinations of various components. A wide variety of elements may be incorporated each with different valency, so long as charge neutrality is satisfied, making perovskites one of the most highly studied materials.

There is a stringent structure-property relationship for perovskites pertaining to both crystal composition and ion arrangement that govern its structural, optical and electronic properties. It has been discovered that the use of a swelling-deswelling microencapsulation process provides for the fabrication or generation of a stable, highly luminescent perovskite (i.e., $CH_3NH_3PbBr_3$ ($MAPbBr_3$))-polymer composite that has great dispersion and passivation of crystalline perovskite nanocrystals or perovskite nanoparticles within a polymer matrix.

In certain embodiments, methods of making these highly stable perovskite-polymer composites are provided. First, perovskite precursors in solution are prepared and are contacted with a polymer matrix. The contacting is in the presence of a solvent. A solvent-induced polymer swelling-deswelling process is created where the solvent penetrates polymer in the polymer matrix causing swelling and entry of perovskite precursors into the polymer. The solvent is removed from the polymer matrix leaving the perovskite precursors in the polymer matrix to react and form perovskite nanocrystals. The polymer subsequently deswells forming a barrier layer around the perovskite nanocrystals to create a stable perovskite-polymer composite.

The perovskite precursor solution comprising $PbX_2$ and $RNH_3X$ to yield $RNH3PbX_3$ is in solvent in certain embodiments and is processed onto the polymer matrix using a process selected from the group consisting of spin coating, dip coating, slot die coating, ink jet coating, spray coating and cotton swab painting. The perovskite precursor solution may be an inorganic solution comprising $PbX_2$ and $CsX$ to yield $CsPbX_3$ in solvent.

In certain embodiments, solvents are selected from the group consisting of dimethylformamide (DMF), dimethyl sulfoxide (DMSO), r-butyrolactone (GBL), acetone, and acetonitrile. The solvent may be removed by baking at 25-120 degrees Celsius.

In other embodiments, the polymer is selected from the group consisting of polystyrene (PS), polycarbonate (PC), cellulose acetate (CA), polyvinal chloride (PVC), poly (vinylidene fluoride), (PVDF), polyurea (PU), poly (methyl methacrylate) (PMMA), polyvinyl alcohol (PVA), and polynitriles.

Perovskite-polymer composites made by the method of claim 1 are provided and described in Table A and Example 1-3.

In certain embodiments, an precursor solution is prepared using $PbBr_2$ and $CH_3NH_3Br$ combined 1:3 or 4:5 in dimethylformamide to yield $MAPbBr_3$, a solute ready to be introduced into a polymer matrix.

Second, the perovskite-precursor solution comprising $MAPbBr_3$ is processed directly onto a polymer substrate through spin coating, dip coating, slot die coating, spray coating, ink jet printing, or cotton swab painting. Spin coating is a procedure used to deposit uniform thin films to flat substrates. A small amount of coating material is usually applied on the center of the substrate that is either spinning at low speed or not spinning at all. The substrate is then rotated at high speed in order to spread the coating material by centrifugal force. A machine used for spin coating is called a spin coater, or simply spinner. Rotation is continued while the fluid spins off the edges of the substrate, until the desired thickness of the film is achieved. The applied solvent is usually volatile, and simultaneously evaporates. So, the higher the angular speed of spinning, the thinner the film. The thickness of the film also depends on the viscosity and concentration of the solution and the solvent.

Dip coating is an industrial coating process that may have been used to make candles. For flexible laminar substrates such as fabrics, dip coating may be performed as a continuous roll-to-roll process. For coating a 3D object, it may simply be inserted and removed from the bath of coating. For some products, such as early methods of making candles, the process is repeated many times, allowing a series of thin films to bulk up to a relatively thick final object. The dip-coating process can be separated into five stages:

Immersion: The substrate is immersed in the solution of the coating material at a constant speed (preferably jitter-free).
Start-up: The substrate has remained inside the solution for a while and is starting to be pulled up.
Deposition: The thin layer deposits itself on the substrate while it is pulled up. The withdrawing is carried out at a constant speed to avoid any jitters. The speed determines the thickness of the coating (faster withdrawal gives thicker coating material).
Drainage: Excess liquid will drain from the surface.
Evaporation: The solvent evaporates from the liquid, forming the thin layer. For volatile solvents, such as alcohols, evaporation starts already during the deposition & drainage steps.

Slot die coating technology is used to deposit a variety of liquid chemistries onto glass, stainless steel, and plastic substrates for the development and production of a broad range of applications. This is achieved through the precise metering the process fluid and dispensing it at a controlled rate while the coating die is precisely moved relative to the substrate.

The term "ink jet coating" is an emerging manufacturing technique in which ink jet technology is used to deposit materials on substrates. The technique aims to eliminate fixed costs of production and reduce the amount of materials used.

Spray coating is a coating technique where a device sprays a coating (paint, ink, varnish, etc.) through the air onto a surface. The most common types employ compressed gas—usually air—to atomize and direct the paint particles.

Third, a solvent (e.g., dimethylformamide) penetrates the polymers, causes them to swell, and as a result, brings the perovskite precursors into the swelled polymers. A solution of different concentrations of perovskites were tested in solvent and it was found that PL wavelength was dependent of perovskite concentrations, as shown in FIG. 11A-11F. More specifically, when being brought into contact with good solvents, polymer chains will swell and expand, letting in solvents and solutes. Such expansion is generally recoverable through a deswelling process when solvent is evaporated. Perovskite precursors can be introduced into polymer matrixes as solute through the solvent-induced polymer swelling process. When the solvent is driven out of the polymer matrix (for example, by baking or subject the matrix to a vacuum condition), the perovskite precursors will be left within to react and form high quality, well dispersed perovskite nanoparticles. Meanwhile the polymer matrix will deswell, shrink back and form coherent barrier layer around the perovskite nanoparticles, protecting them from water, oxygen or heat of the surrounding environments (FIG. 1A).

Any solvent or combination of solvents that is capable of dissolving the various ingredients at a super-ambient temperature at a sub-ambient temperature may be used. The temperature could be between room temperature and high temperature close to boiling points of the solvents, roughly between 25° C. and 120° C. The solvent may be selected from protic solvents such as monohydric and polyhydric alcohols. Such protic solvents include ethylene glycol, propylene glycol, butylene glycol, methanol, ethanol, propanol, butanol, particularly 2-butanol, and a mixture thereof. Non-protic solvents, such as acetonitrile, dimethyl formamide (DMF), dimethyl sulfoxide (DMSO), r-butyrolactone (GBL), and tetrahydrofuran can also be used either alone or in combination with a protic solvent. A combination of protic solvents with other, less polar protic or non-protic solvents may also be used.

Preferably, the ingredients are contacted at a super-ambient temperature from about 80 to 140° C., more preferably at a super-ambient temperature of about 116° C. Contacting is carried at a temperature and for a length of time sufficient to produce a perovskite. The resulting reaction mixture is then cooled slowly to a sub-ambient temperature, usually in the range from about −30 to +20° C., preferably to a sub-ambient temperature, which is about −20° C. Preferably, the cooling rate is about 1.5° C./hour. However, somewhat faster or slower rates may also be used.

B. Perovskite-Polymer Composites

A perovskite-polymer composite made by the methods described herein are provided in certain embodiments. The perovskite, most commonly denoted as $ABX_3$, often has the A site occupied by an organic component. Similarly to its parent oxide perovskite, perovskites must obey allowable tolerance factors to achieve desired crystal symmetry. The structural dimensionality of perovskites can be easily tuned through varying components to obtain zero-dimensional (0D) (e.g. $(CH_3NH_3)_4PbX_6 2H_2O$), one-dimensional (1D) (e.g. $C_5H_{10}NH_2PbX_3$), two dimensional (2D) (e.g. $C_nH_{2n+1}NH_3PbX_4$), and three dimensional ($CH_3NH_3PbX_3$) structures simply by changing organic-inorganic precursor components and/or molar ratios. Here a clear distinction between organic and inorganic perovskites must be noted. Aside from a clear difference in A species, inorganic (e.g. Cs+) versus organic (e.g. $CH_3NH_3+$), there is also a change in symmetry of the A site component from spherical (inorganic) to non-spherical organic.

The basic structural motif of the perovskite family is the $ABX_3$ structure, which has a three-dimensional network of corner-sharing $BX_6$ octahedra. See FIG. 12. The B component in the $ABX_3$ structure is a metal cation that can adopt an octahedral coordination of X anions. The A cation is situated in the 12-fold coordinated holes between the $BX_6$ octahedra and is most commonly inorganic. By replacing the inorganic A cation with an organic cation, an organic-inorganic perovskite can be formed.

The cation A may be selected from the group consisting of RNH3 where R is $CH_3$ where R is unsubstituted or substituted $C_1$-$C_{20}$ alkyl or inorganic ion wherein A is Cs+-B may be a divalent metal cation selected from the group consisting of Ca2+, Sr2+, Cd2+, Cu2+, Ni2+, Mn2+, Fe2+, Co2+, Pd2+, Ge2+, Sn2+, Pb2+, Sn2+, Yb2+, and Eu2, preferably Pb2+, Sn2+, Ge2+, more preferably, Pb2+. X may be one or more different halide anions selected from the group consisting of fluoride (F−), chloride (Cl−), bromide (Br−), iodide (I−), preferably, Br−.

In these ionic compounds, the organic component is a part of the structure, since the structure actually depends on the organic cation for charge neutrality. Therefore, such compounds conform to specific stoichiometries. For example, if X is a monovalent anion such as a halide, and A is a monovalent cation, then B should be a divalent metal. Layered, two-dimensional $A_2BX_4$, $ABX_4$ and one-dimensional $A_3BX_5$, $A_2A'BX_5$ perovskites also exist and are considered derivatives of the three-dimensional parent family. See, D. B. Mitzi, *Prog. Inorg. Chem.*, 48, 1 (1999) where a review is presented of the state of the art and describes organic-inorganic perovskites that combine the useful properties of organic and inorganic materials within a single molecular-scale composite.

A Cation

The most widely used A cation for organic-inorganic perovskites is the small methylammonium ion (MA; $CH_3NH_3+$; $R_{MA}$=0.18 nm). Thus, one may speculate that substitution of MA with a larger cation should yield higher symmetry and correspondingly a smaller band gap to allow for enhanced light harvesting across the spectrum. In a quest to replace the unfavorably sized MA ion, other cations have been explored that include ethylammonium (EA), formamidinium (FA) and cesium (Cs), where $R_{Cs} < R_{MA} < R_{FA} < R_{EA}$. However, replacement of MA with an excessively large cation, such as EA ($CH_3CH_2NH_3+$) disrupts the 3D symmetry yielding a 2D orthorhombic crystal structure with a relatively large band gap of 2.2 eV for $EAPbI_3$. Thus, it is apparent that an organic cation whose ionic radius is between that of MA and EA is desirable for 3D perovskite.

B Cation

The B metal cation sites in organic-inorganic perovskites are occupied by the group IVA metals in a divalent oxidation state ($Pb^{2+}$, $Sn^{2+}$, $Ge^{2+}$). Lead (Pb) has proven the superior constituent compared to tin (Sn), both in terms of performance and stability, and consequentially has been the most widely employed of the group IVA metals. Upon proceeding up group IVA on the periodic table (Pb→Ge), a reduction in stability of the divalent oxidation state occurs for each element as a consequence of reduced inert electron pair effects. However, this also corresponds to an increase in electronegativity, or covalent character, that in turn yields a reduction in band gap. Thus, one may speculate the ideal case to be a lower atomic number group IVA element, however, this also goes hand-in-hand with a compromise in divalent metal stability.

X Anion

The halide anion has been the most effectively varied component in organic-inorganic perovskites. Upon proceeding down group VIIA (Cl→I) atomic size increases, absorption spectra shifts to longer wavelengths, and a reduction in energy (redshift) occurs. This can be attributed to the decrease in electronegativity to better match that of Pb, effectively reducing ionic and increasing covalent character. Bromide has been most effectively used to tune the band gap of organic-inorganic perovskites. $MAPbBr_3$ adopts a cubic structure at room temperature.

The perovskite-polymer composite s made by the methods described herein may be used as downconverters for a backlight unit (BLU) of liquid crystal displays (LCDs) and be used for photovoltaic applications. The polymer is one or a combination selected from the group consisting of polystyrene (PS), polycarbonate (PC), cellulose acetate (CA), polyvinyl chloride (PVC), poly (vinylidene fluoride), (PVDF), polyurea (PU), poly (methyl methacrylate) (PMMA), polyvinyl alcohol (PVA), and polynitriles. In other embodiments, a perovskite-polymer composite is comprised of perovskite nanocrystals having a polymer coating. The polymer coating serves as a barrier layer around the perovskite nanocrystals to create a protective coating from environmental stresses (e.g., heat, moisture, cold). The perovskite-polymer composite is water resistant for at least about two months, and thermally stable from 100 degrees Celsius to about 200 degrees Celsius.

5. Examples

The invention is illustrated herein by the experiments described by the following examples, which should not be construed as limiting. The contents of all references, pending patent applications and published patents, cited throughout this application are hereby expressly incorporated by reference. Those skilled in the art will understand that this invention may be embodied in many different forms and should not be construed as limited to the embodiments set forth herein. Rather, these embodiments are provided so that this disclosure will fully convey the invention to those skilled in the art. Many modifications and other embodiments of the invention will come to mind in one skilled in the art to which this invention pertains having the benefit of the teachings presented in the foregoing description. Although specific terms are employed, they are used as in the art unless otherwise indicated.

Example 1: Materials and Methods

Polystyrene (PS) substrates were purchased. Polycarbonate (PC) films, acrylonitrile-butadiene-styrene (ABS) films, cellulose acetate (CA) films, polyvinyl chloride (PVC) films and polymethylmethacrylate (PMMA) sheets were. RNH$_3$X (CH$_3$NH$_3$=MA) was purchased from Luminescence Technology Corp. PbX$_2$) and N, N-Dimethylformamide (DMF), were purchased from Sigma-Aldrich.

Characterizations

Fluorescence images were taken using an Olympus BX51 microscope. Light source of 450 nm-480 nm was used for excitation. SEM characterizations performed with a high resolution field-emission scanning electron microscope (Philips-FEI XL30-SFEG). All samples for SEM measurements were coated with Au. Transmission electron microscope (TEM) analyses on the cross-sections of the MAPbBr$_3$-polymer composite films were carried out using FEI Tecnai F30 TEM. The cross-sectional samples were prepared using FEI 200 TEM focused-ion-beam (FIB) instrument.

The photoluminescence quantum yield (PLQY) of the films was measured by the integrating sphere method. An intensity-modulated 409 nm laser beam was used for excitation. The blank sample of each polymer substrate was firstly measured, and the absorption effect of the polymer films was deducted when calculating the PLQY. All the PLQY measurements were carried out in air at room temperature.

Ultraviolet-visible absorption spectra were recorded on a CARY 300 Bio spectrophotometer at room temperature. The steady-state PL of MAPbBr$_3$-polymer films was measured using Horiba Nanolog Spectrofluorometer.

Stability Tests

For water stability test, all MAPbBr$_3$-polymer composites without further protection were immersed in water at room temperature for two months.

For temperature-dependent PL measurements, laser excitation at 457 nm (Argon laser: Stellar-Pro Select 150) was used and the MAPbBr$_3$-polymer films were in-situ heated on the stage whose temperature was controlled by a temperature controller (Linkam TMS 94). Photoluminescence spectra were measured by an Ocean Optics Spectrometer (USB 2000+).

For boiling water test, MAPbBr$_3$-PS and MAPbBr$_3$-PC composites were put into boiling water and last for about 20 seconds, 10 minutes, and 30 minutes respectively, before they were taken out, and cooled down to room temperature for optical microscope, UV-Vis absorption spectra, and PLQY characterizations (see Table E).

Example 2: Synthesis of Perovskite-Polymer Composites listed in Table A

Perovskite-polymer composites: MABr (MA=CH$_3$NH$_3$) and PbBr$_2$ (3:1 molar ratio) with overall concentration of 5 mg/ml, 10 mg/ml, 20 mg/ml, 50 mg/ml or 80 mg/ml were prepared in DMF with overall volume of 5 ml while stirring for overnight before use. MAPbBr$_3$ solutions were processed onto different polymer substrates (including Polystyrene (PS), Polycarbonate (PC) films, acrylonitrile-butadiene-styrene (ABS) films, cellulose acetate (CA) films, polyvinyl chloride (PVC) films and polymethylmethacrylate (PMMA) sheets, Polyurethane (PU)) to form MAPbBr$_3$-PS, MAPbBr$_3$-PC, MAPbBr$_3$-ABS, MAPbBr$_3$-CA, MAPbBr$_3$-PVC and MAPbBr$_3$-PMMA through cotton swab painting or spin-coating at 3000 rpm, followed by baking at 80° C. for 2 hours inside glovebox. Swelling occurred once the precursor solutions were brought into contact with polymer substrate, either through simple cotton swab painting or spin-coating in a more controllable manner. Upon subsequent annealing of the substrates, visible color changes from transparent (for most polymers) or semiclear (for ABS film) to light green were observed, indicating OIP phase formations along with solvent evaporation and polymer deswelling.

TABLE A

Highly Stable MAPbBr$_3$-Polymer Composites

Figures 2A, 2B, 2C, 2D, 2E, 2F, 2G, 2H, 2I, 2J, 2K, 2L:
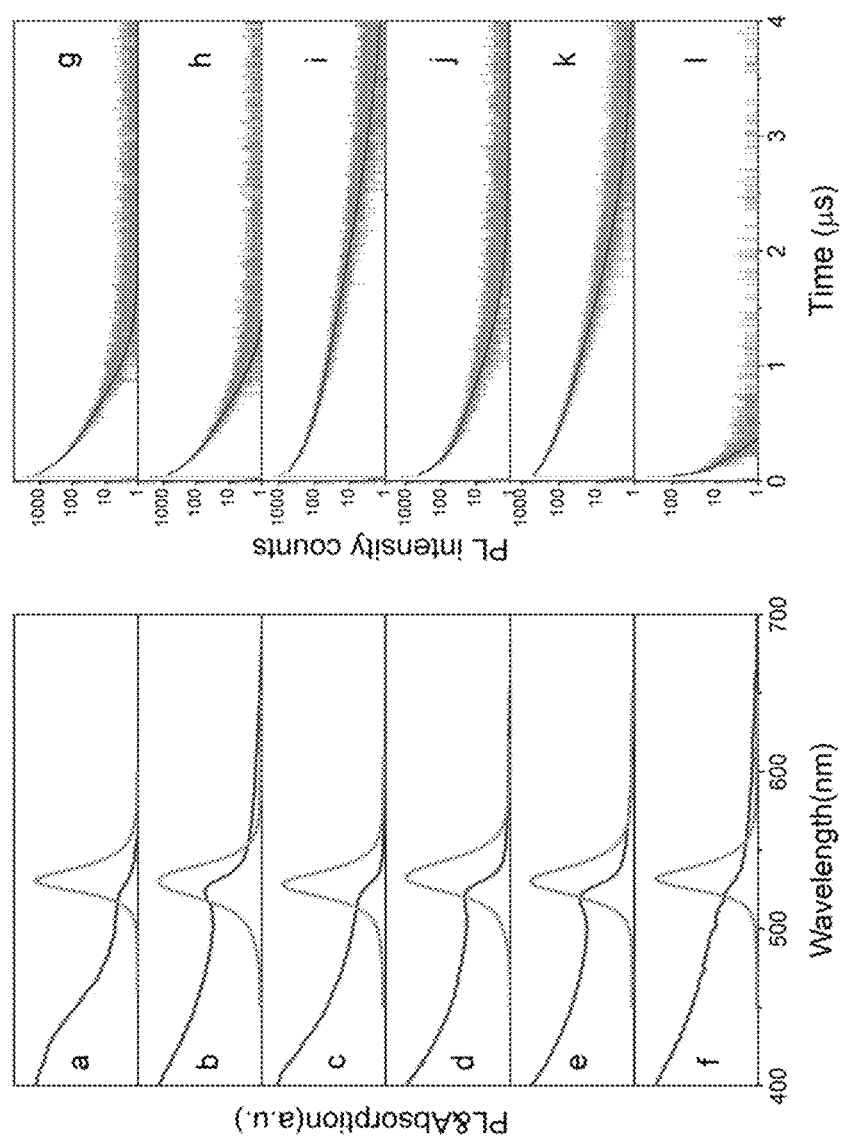
FIG. 2A-2L. Optical properties for MAPbBr$_3$-polymer composites.
Figures 3A, 3B, 3C, 3D:
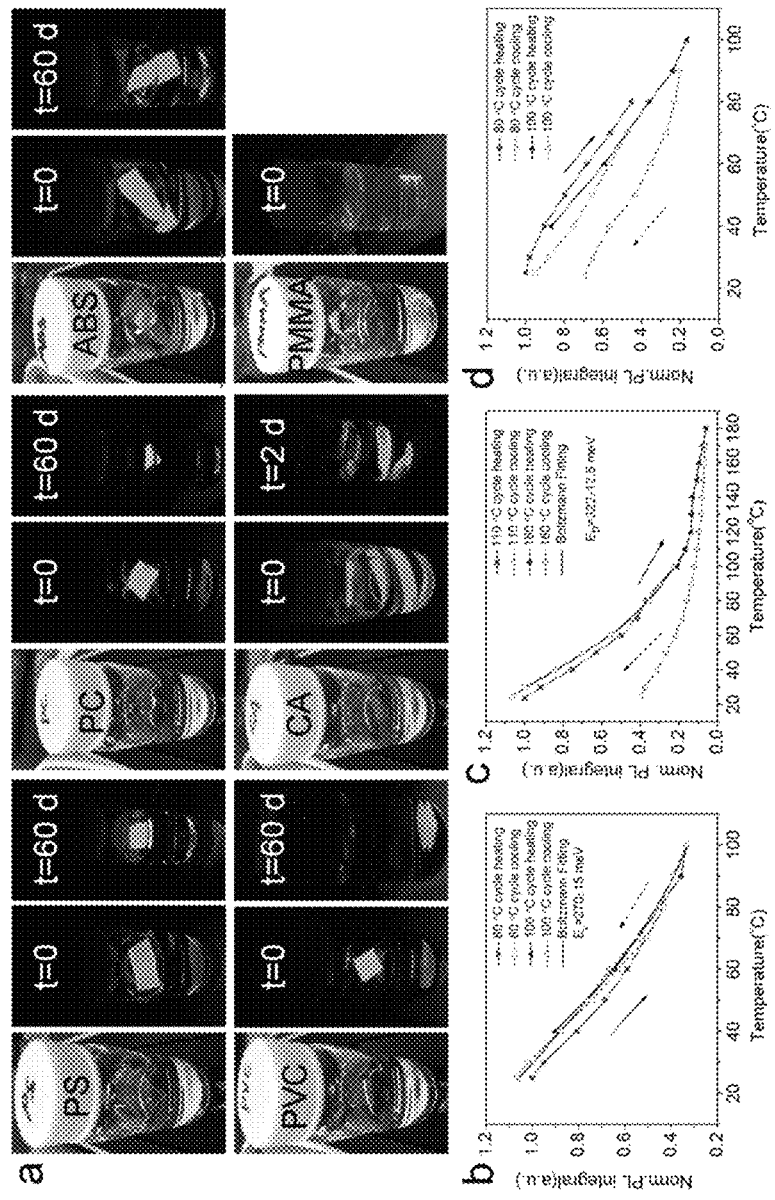
FIG. 3A-3D. Water and thermal stability characterizations.
Figures 5A, 5B, 5C, 5D, 5E:
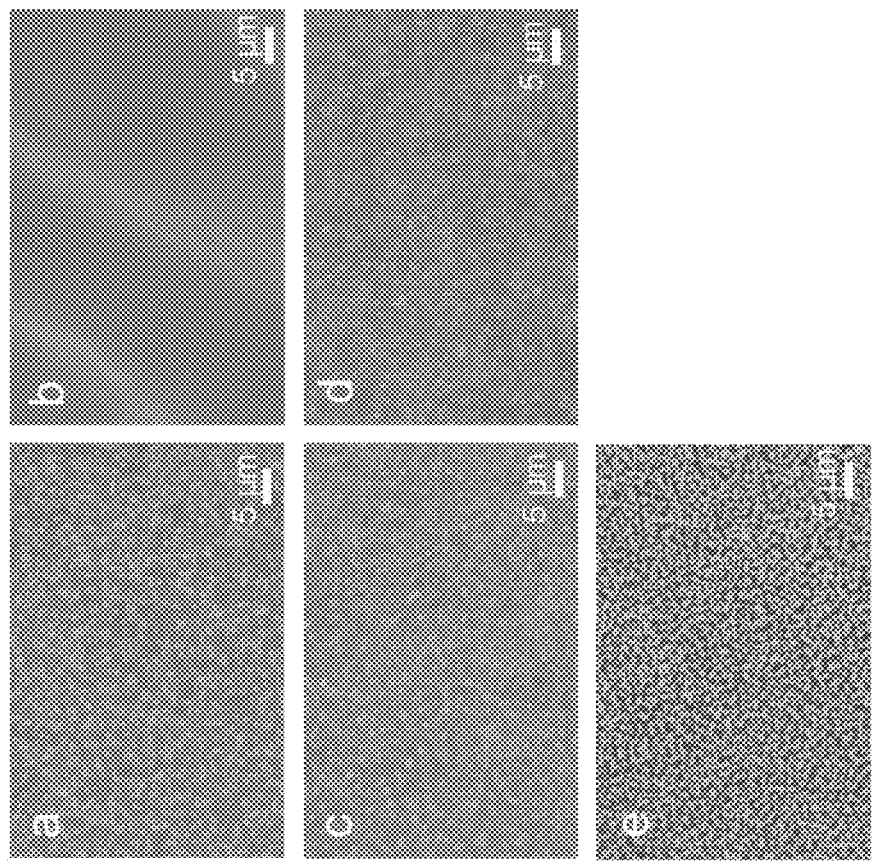
FIG. 5A-5E. Fluorescence optical microscopy images of MAPbBr$_3$-polymer composites.
Figures 6A, 6B, 6C, 6D, 6E, 6F, 6G, 6H, 6I, 6J:
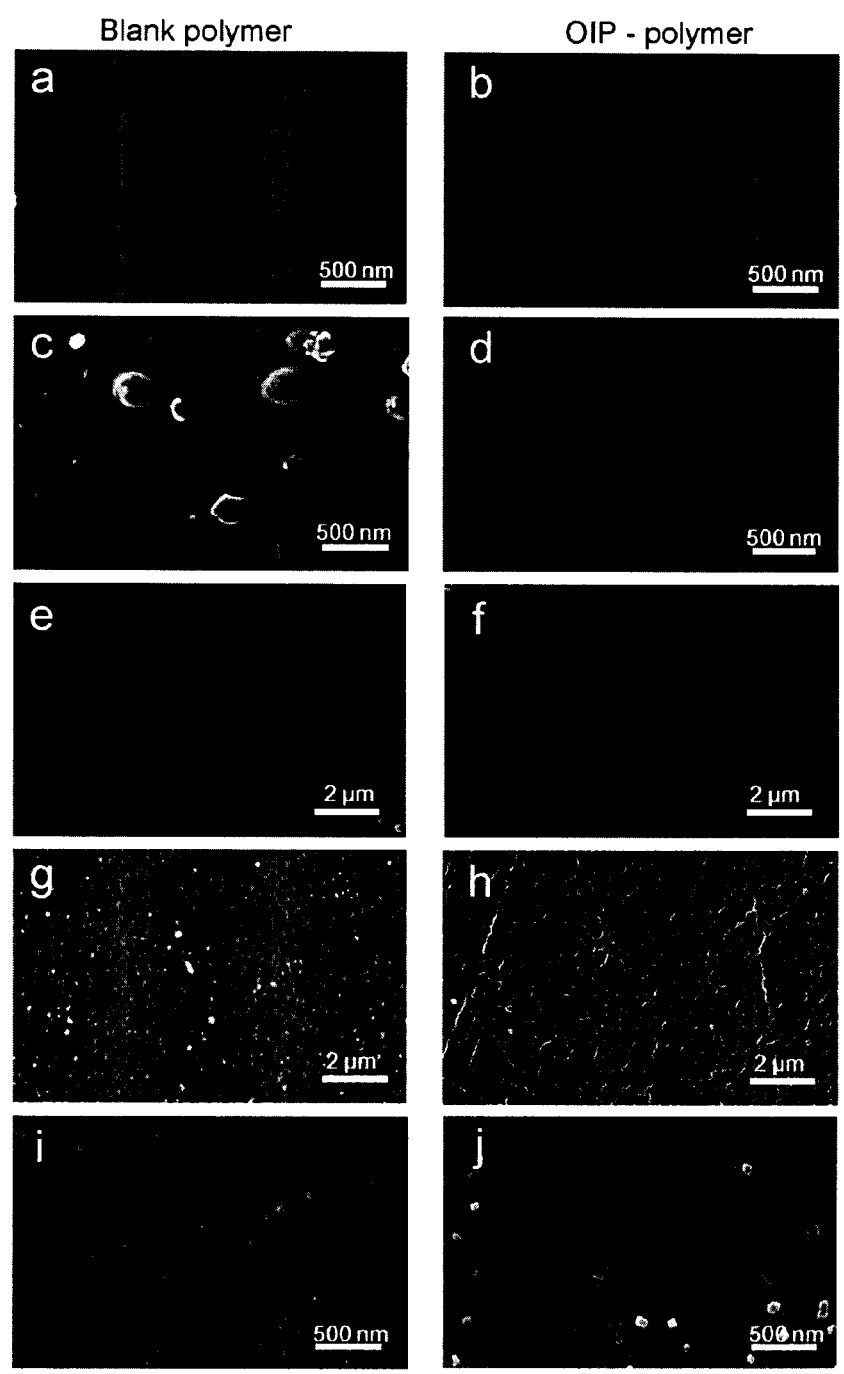
FIG. 6A-6J. SEM top view images of blank substrate polymers and MAPbBr$_3$-polymer composites.
Figures 7A, 7B:
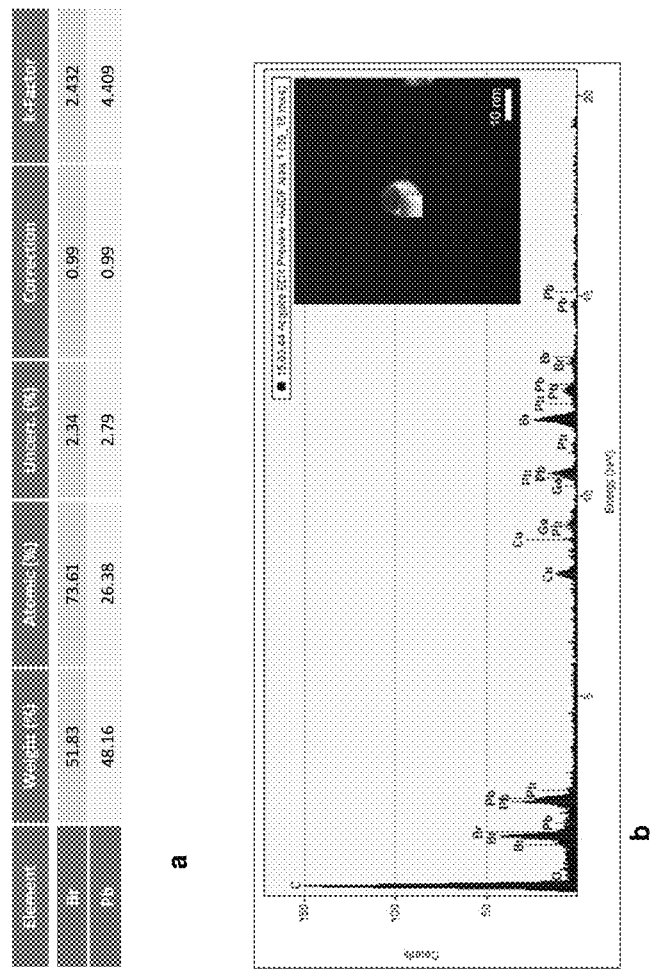
FIG. 7A-7B. EDS characterization of single MAPbBr$_3$ nanoparticle.
Figures 8A, 8B, 8C:
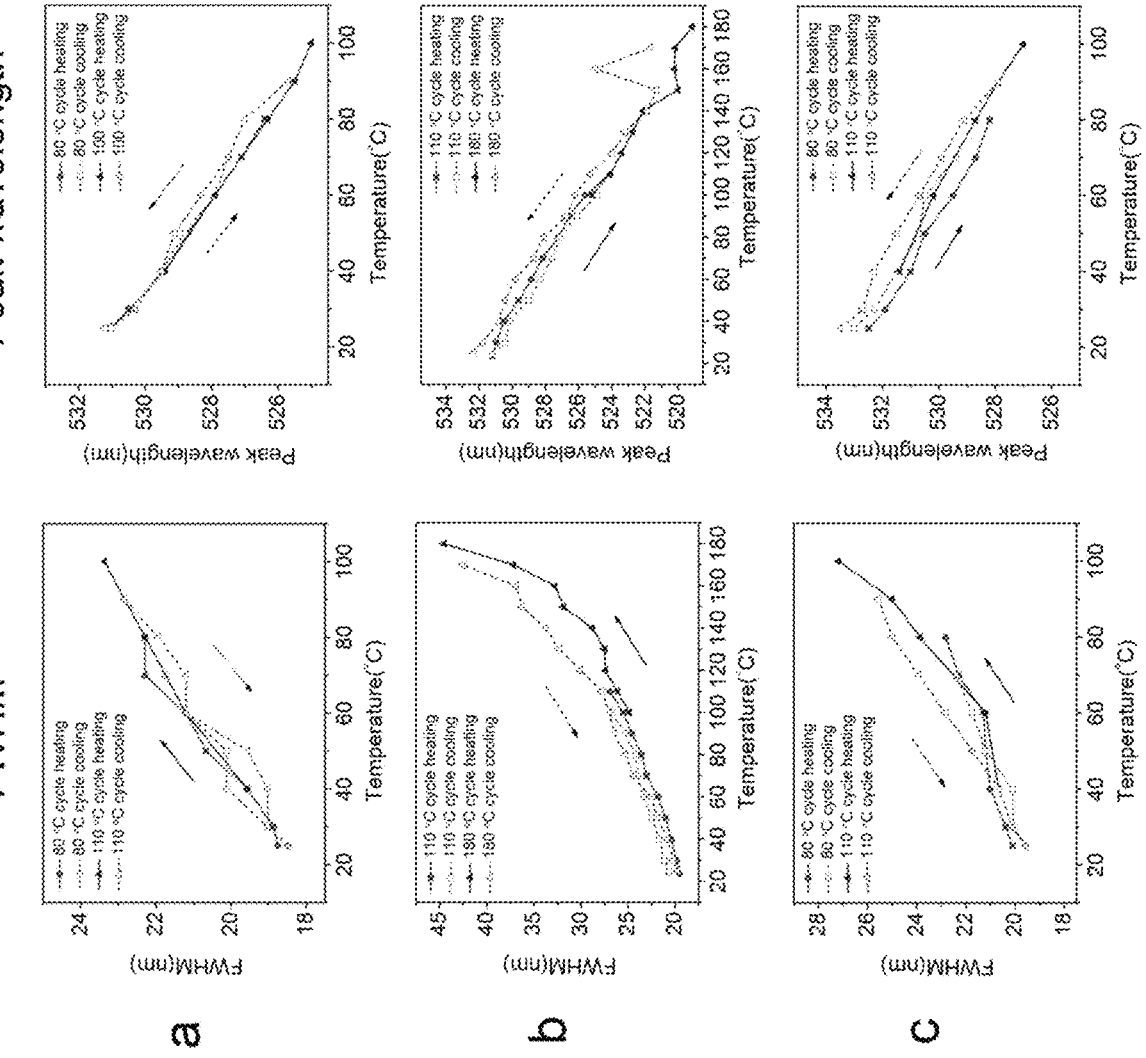
FIG. 8A-8C. Temperature-dependent photoluminescence peak wavelength (left column) and FWHM (right column) of MAPbBr$_3$-polymer composite.
Figures 9A, 9B, 9C:
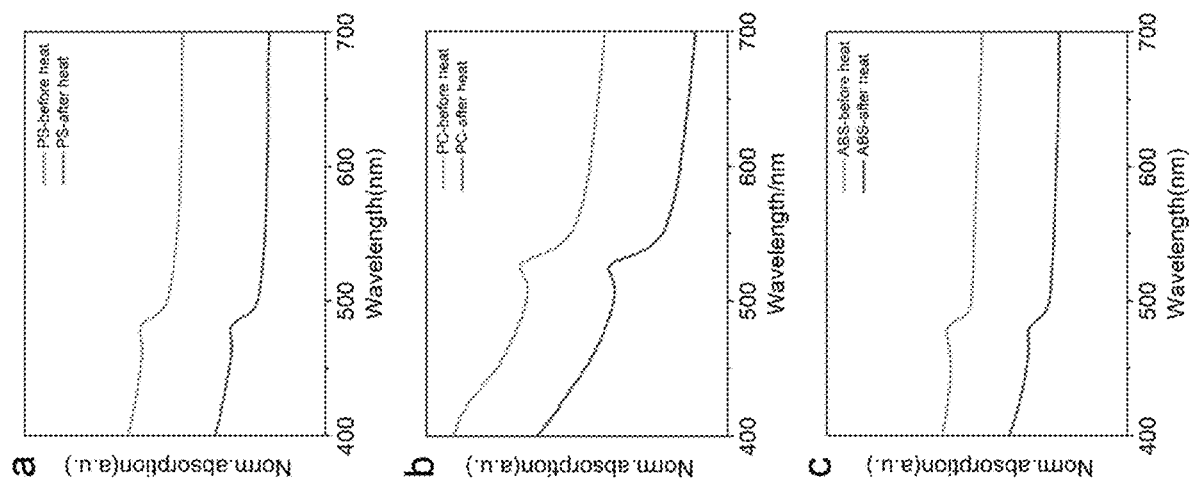
FIG. 9A-9C. UV-Vis spectra of the MAPbBr$_3$-polymer composites before and after heating.
Figures 10A, 10B, 10C, 10D, 10E, 10F:
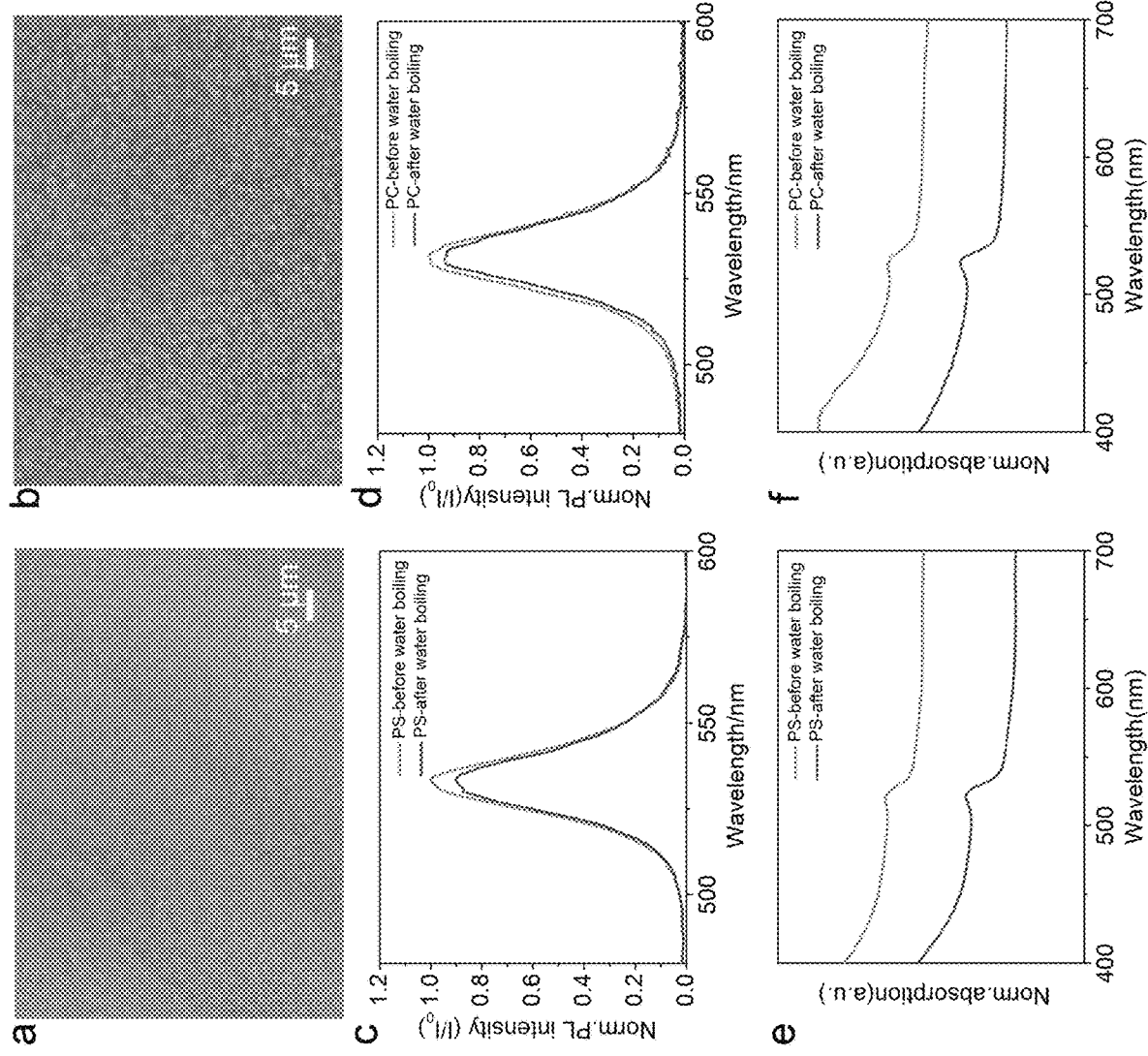
FIG. 10A-10F. Water boiling effect characterizations.
Figures 11A, 11B, 11C, 11D, 11E, 11F:
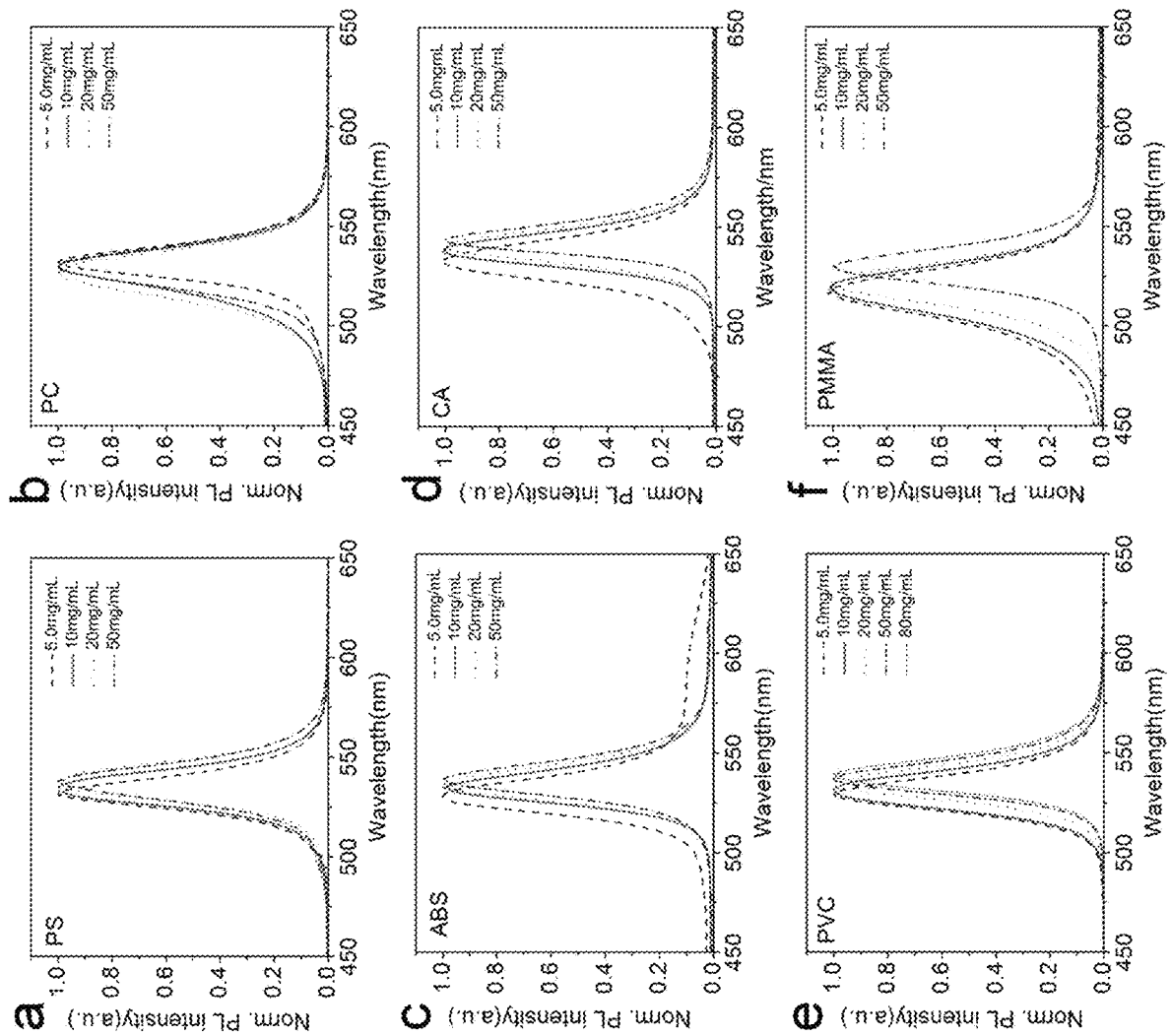
FIG. 11A-11F. Concentration-dependent PL emission spectra of perovskite/polymer composites.

| Type of MAPbBr$_3$-Polymer Composite | Data |
| --- | --- |
| MAPbBr$_3$-PS | FIG. 1B$_1$; FIG. 1C$_1$; FIG. 1D-1H; FIG. 2A; FIG. 2G; FIG. 3A-3B; FIG. 7A-7B; FIG. 8A. FIG. 9A; FIG. 10A; FIG. 10C; FIG. 10E; FIG. 11A |
| MAPbBr$_3$-PC | FIG. 1B$_2$; FIG. 1C$_2$; FIG. 2B; FIG. 2H; FIG. 3A; FIG. 3C; FIG. 6A-6B; FIG. 8B; FIG. 9B; FIG. 10B; FIG. 10D; FIG. 10F; FIG. 11B |
| MAPbBr$_3$-ABS | FIG. 1B$_3$; FIG. 1C$_3$; FIG. 2C; FIG. 2I; FIG. 3A; FIG. 3D; FIG. 5B; FIG. 6C-6D; FIG. 8C; FIG. 9C; FIG. 11C |
| MAPbBr$_3$-CA | FIG. 1B$_4$; FIG. 1C$_4$; FIG. 2D; FIG. 2J; FIG. 3A; FIG. 5C; FIG. 6E; FIG. 6F; FIG. 11D |
| MAPbBr$_3$-PVC | FIG. 1B$_5$; FIG. 1C$_5$; FIG. 2E; FIG. 2K; FIG. 3A; FIG. 5D; FIG. 6G-6H; FIG. 11E |
| MAPbBr$_3$-PMMA | FIG. 1B$_6$; FIG. 1C$_6$; FIG. 2F; FIG. 2L; FIG. 3A; FIG. -5E; FIG. 6I-6J; FIG. 11F |

CdSe based red quantum dots were synthesized following reported methods [Liu, W. H.; Breen, C.; Method of making quantum dots. International Patent Application Number: PCT/US2012/066140; Publication Number: WO 2013/078245 A1.]. Quantum dots in chlorobenzene were spin coated at 3000 rpm on a PC film to obtain the red luminescent film.

Example 3: Characterization of MAPbBr$_3$-Polymer Composites

All MAPbBr$_3$-polymer composites were obtained either with cotton swab painting (FIG. 1B) or spin coating (FIG. 1C), and were highly luminescent under UV excitations. Microscopic characterizations of MAPbBr$_3$-PS composites provided evidence of swelling-deswelling microencapsulation. When adjusting the focal plane of fluorescence microscopy to ~4 μm underneath the top surface of the MAPbBr$_3$-PS sample, uniformly distributed nanoparticles over large area were observed (FIG. 1D), while focusing on the top surface yields no particle-like features. Scanning electron microscopy (SEM) characterizations of the PS sample surfaces before (FIG. 1E) and after (FIG. 1F) MAPbBr$_3$ processing showed identically smooth morphology with no visible OIP crystals on top, confirming that the nanocrystals observed in fluorescence microscopy are mainly embedded inside the polymer matrix and the substrate surface itself has fully recovered through the deswelling process. Similar embedded nanoparticles were also observed for MAPbBr$_3$-PC, MAPbBr$_3$-CA and MAPbBr$_3$-PVC composites (FIG. 5A-5B and FIG. 6A-6J). For semiclear MAPbBr$_3$-ABS, no particle-like features can be observed in fluorescence microscopy (FIG. 5B), mainly due to the highly scattering nature of ABS polymers, but SEM indicates the originally rough ABS surface has been smoothed out after the spin coating process (FIG. 6C and FIG. 6D). For MAPbBr$_3$-

PMMA, nanoparticles were observed on the surface in both fluorescence microscopy and SEM images, probably due to relatively low swelling ratio of PMMA in DMF solvent.

Cross-sectional transmission electron microscopy (TEM) image (FIG. 1G) of the MAPbBr$_3$-PS sample (Table B) showed well dispersed crystalline nanoparticles closely passivated within the amorphous PS substrate matrix. From the HRTEM (FIG. 1H) and the fast Fourier transformation (FFT) image (inset of FIG. 1H), interplanar distances of 2.9 Å and 4.1 Å corresponding to (200) and (110) crystal faces of MAPbBr$_3$ crystal were identified. The energy-dispersive spectroscopy (EDS) measurement shows the nanoparticle has a Br/Pb molar ratio of 2.8:1 (FIG. 7A-7B), being in accordance with the stoichiometry of MAPbBr$_3$. In this swelling-deswelling strategy, MAPbBr$_3$ crystallization, nanocrystal dispersion and polymer passivation occurs simultaneously, leading to nanoparticles that are protected from the external stress marvelously well.

TABLE B

Pb and Br atomic ratio of MAPbBr$_3$ dispersed in PS

| Element | Weight (%) | Atomic (%) | Uncert. (%) | Correction | k-Factor |
|---------|------------|------------|-------------|------------|----------|
| Br | 51.83 | 73.61 | 2.34 | 0.99 | 2.432 |
| Pb | 48.16 | 26.38 | 2.79 | 0.99 | 4.409 |

FIG. 2A-2F illustrates the static and transient photoluminescence (PL) behavior and absorption spectra of the spin-coated MAPbBr$_3$-polymer composite films. The abrupt absorption onsets and emission peaks centered around 528~533 nm correspond well with the band-to-band transition of bromide perovskite. Their full-widths-half-maxima (FWHM) range between 18 nm to 24 nm (Table C).

TABLE C

Peak wavelength and Full Width at Half Maximum (FWHM) of Photoluminescence spectra of MAPbBr$_3$-polymer composites

| Substrate | Wavelength (nm) | FWHM (nm) |
|-----------|-----------------|-----------|
| PS | 532 | 18 |
| PC | 531 | 23 |
| ABS | 528 | 20 |
| CA | 533 | 24 |
| PVC | 531 | 23 |
| PMMA | 532 | 18 |

The PLQYs of these films in Table D can reach can reach as high as ~48%, for MAPbBr$_3$-ABS composites, which is the highest value for reported MAPbBr$_3$ solid composite films to the best of our knowledge.

TABLE D

PL radiative lifetime of various MAPbB$_3$-polymer composites

| Substrate | $\tau_1$ (ns) | $f_1$ (%) | $\tau_2$ (ns) | $f_2$ (%) | $\tau_{avg.}$ (ns) | PLQY (%) |
|-----------|---------------|-----------|---------------|-----------|--------------------|----------|
| PS | 198.32 | 52.78 | 57.35 | 47.22 | 131.75 | 33 |
| PC | 194.45 | 60.84 | 47.79 | 39.16 | 137.02 | 31 |
| ABS | 673.8 | 67.44 | 146.9 | 32.53 | 502.24 | 48 |
| CA | 337.9 | 60.62 | 57.69 | 39.38 | 227.55 | 47 |
| PVC | 499.0 | 71.89 | 136.3 | 28.11 | 397.05 | 16 |
| PMMA | 26.80 | 47.25 | 4.37 | 52.75 | 14.97 | 14 |

$\tau_1$: slow PL lifetime,
$\tau_2$: fast PL lifetime,
$\tau_{avg.}$: average PL lifetime Photoluminescence radiative lifetimes are commonly taken as a hallmark of perovskite film quality, with longer decay lifetimes used as indicators of better performing materials. For MAPbBr$_3$ based solid films or even colloidal nanoparticles, the average radiative lifetimes ($\tau_{avg}$) are usually within 10-100 ns. Remarkably, most MAPbBr$_3$-polymer composites of the present invention showed long $\tau_{avg}$ ranging from 130 ns (for MAPbBr$_3$-PS) to 502 ns (for MAPbBr$_3$-ABS), with the only exception of MAPbBr$_3$-PMMA sample giving out a $\tau_{avg}$ of ~15 ns, which has the MAPbBr$_3$ nanocrystals on surface (Table D).

Good nanoparticle dispersion and polymer passivation were seen. Most MAPbBr$_3$-polymer composites exhibited stability against water and heat attack. No observable PL decay happened for most MAPbBr$_3$-polymer composites upon exposure to ambient air for five months, except MAPbBr$_3$-PMMA, which degraded within an hour. To accelerate the test of water/moisture stability, the samples were put directly into water with their PL monitored periodically under UV illumination (FIG. 3A). The MAPbBr$_3$-PS, MAPbBr$_3$-PC, MAPbBr$_3$-PVC and MAPbBr$_3$-ABS films immersed in water for 2 months revealed less than 10% decay in luminescence intensity, indicating predominant water stability. As for MAPbBr$_3$-CA film, the brightness decayed to 5% of initial value after 48 hours, probably because of the relatively higher water permeability of CA. While MAPbBr$_3$-PMMA became non-luminescent right after being put into water since the MAPbBr$_3$ crystals on surface were washed out right away.

The thermal stability of those water stable MAPbBr$_3$-polymer composites were then tested by heating up to high temperature and cooling back to room temperature while monitoring their PL spectra. Remarkably, the PL intensities (FIG. 3), FWHM and peak wavelength (FIG. 8A-8C) of MAPbBr$_3$-PS and MAPbBr$_3$-PC can fully recover after being heated to 100° C. and 110° C., respectively. Even after heating to 180° C., the MAPbBr$_3$-PC retained ~40% of initial intensity when getting back to room temperature, indicating high thermal stability of these composites even without any special barrier layer protection. As for MAPbBr$_3$-ABS composite film, the decrease of perovskite brightness after cooling back from 100° C. might come from the degradation of ABS substrate, the rubbery phase of which is known to be susceptible to environmental degradation at higher temperature. It is noted that for all three samples, no obvious changes were observed in the UV-Vis absorption peaks and onsets after heating, indicating intact MAPbBr$_3$ nanocrystals (FIG. 9A-9C).

Selected by good water and thermal stability, MAPbBr$_3$-PS and MAPbBr$_3$-PC films were then tested in harsh environment: boiling water. It was observed that these OIP-polymer films remain highly luminescent both in boiling water and after taking out, and the remained morphology, brightness and structure are confirmed by microscopic, PL, and absorption characterizations before and after boiling (FIG. 10A-10F). PLQY characterizations after boiling the samples for 30 minutes showed decay of only less than 7% for MAPbBr$_3$-PC and 15% for MAPbBr$_3$-PS composites (Table D). In comparison, the luminescence of MAPbBr$_3$ films encapsulated with macroscopic PS or PC films were quickly lost in boiling water and can't be recovered.

TABLE E

PLQY of MAPbBr$_3$-PS and MAPbBr$_3$-PC composites
boiled in water for different time

| Sample | Time | | | |
|---|---|---|---|---|
| | 0 s | 10 s | 10 min | 30 min |
| MAPbBr$_3$-PS | 34 | 32 | 30 | 29 |
| MAPbBr$_3$-PC | 31 | 31 | 30 | 29 |

Figures 4A, 4B, 4C, 4D:
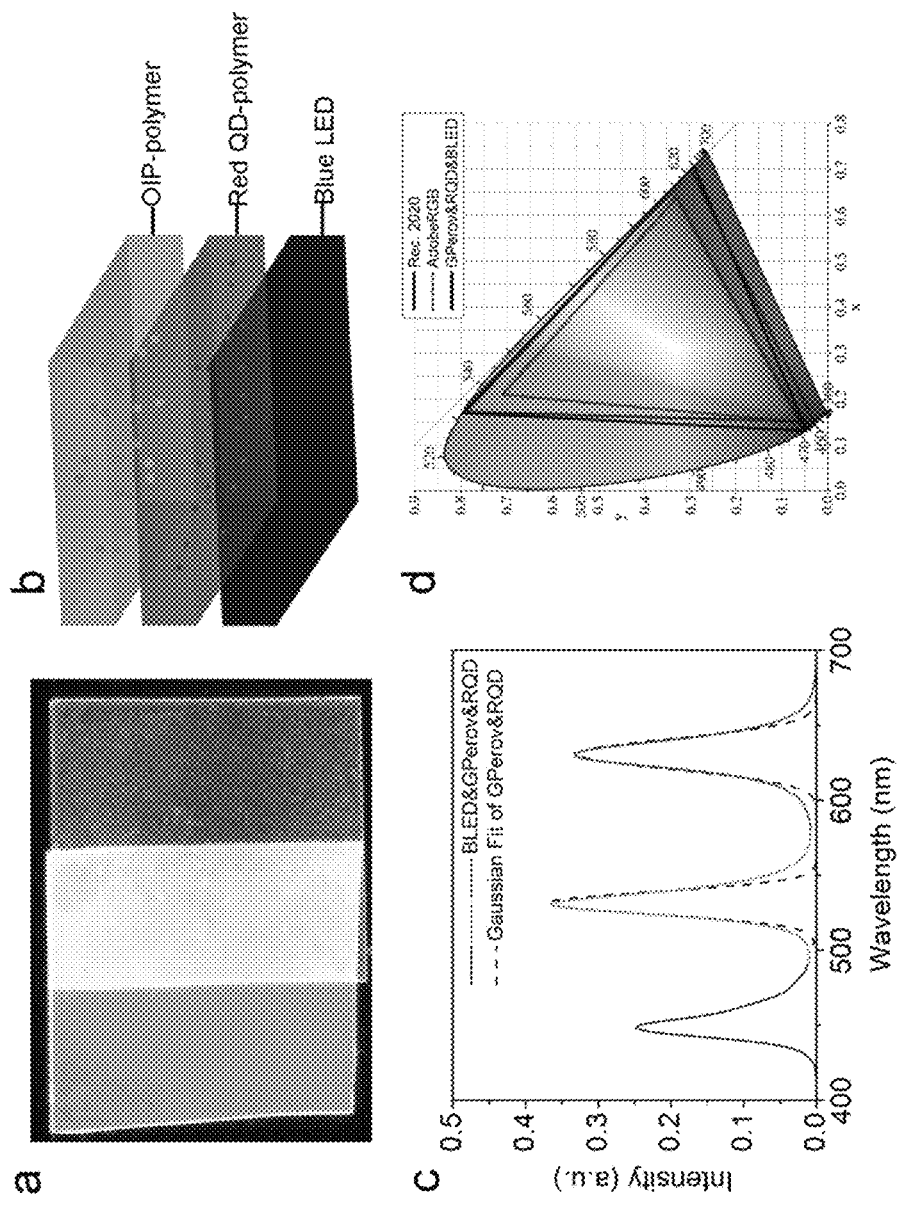
FIG. 4A-4D. Application of MAPbBr$_3$-Polymer composites as down converters for back light units of wide color gamut displays.

Because of their process simplicity, low cost, high stability, high luminescence efficiency and color purity, these OIP-polymer composite have great potential for various applications. The most immediate usage could be as down-converters for the backlight unit (BLU) of liquid crystal displays (LCDs). For concept demonstration, a green MAPbBr$_3$-PC film and a red CdSe based QD-polymer film were prepared. Under the UV light, these films emit saturate and bright green or red light (FIG. 4A). The "remote-phosphor" approach was applied by using a high power blue LED (450 nm with a FWHM of 20 nm) to pump the green perovskite film and the red QD film. The resultant red (630 nm with a FWHM of 23 nm) and green (532 nm with a FWHM of 18 nm) spectra can be well fitted by the Gaussian function. Overall the system can cover over 100% of the Adobe RGB color gamut and 95% of the Rec. 2020 color gamut, the white point is D65, as is illustrated in FIG. 4D. Compared with all QD approach, our hybrid film has the advantage that the green perovskite emission has narrower linewidth (18 nm) compared with the best green QDs (~30 nm), indicating more saturated green color, which is vital for wider color gamut. The above suggested application is comparable to a state-of-the art quantum dot product: quantum dot enhanced film (QDEF) for company like Nanosys Inc. Besides these QDEF like application. The composite film can also work with blue LED with on chip red phosphor (for example, the narrow band potassium fluorosilicate (PFS) phosphors developed by GE) to form Red, Green and Blue (RGB) components of high color quality white light that are well suited for LCD display backlight applications.

REFERENCES

All references hereby incorporated by reference in their entirety.
1. Green, M. A., Ho-Baillie, A. & Snaith, H. J. The emergence of perovskite solar cells. *Nature Photon.* 8, 506-514 (2014).
2. Lee, M., Teuscher, J., Miyasaka, T., Murakami, T. & Snaith, H. Organometal halide perovskites efficient hybrid solar cells based on meso-superstructure *Science* 338, 643-647 (2012).
3. Yang, W. S. et al. High-performance photovoltaic perovskite layers fabricated through intramolecular exchange. *Science* 348, 1234-1237 (2015).
4. Stranks, S. D. & Snaith, H. J. Metal-halide perovskites for photovoltaic and light-emitting devices. *Nature Nanotech.* 10, 391-402 (2015).
5. Pathak, S. et al. Perovskite crystals for tunable white light emission. *Chem. Mater.* 27, 8066-8075 (2015).
6. Berry, J. et al. Hybrid organic-inorganic perovskites (HOIPs): opportunities and challenges. *Adv. Mater.* 27, 5102-5112 (2015).
7. Loo, L. & Patel, P. Perovskite photovoltaics: David Mitzi addresses the promises and challenges. *MRS Bull.* 40, 636-637 (2015).
8. von Hauff, E., Lira-Cantu, M., Brown, T. M. & Hoppe, H. Emerging Thin-film photovoltaics: stabilize or perish. *Adv. Energy Mater.* 5 (2015).
9. Leijtens, T. et al. Stability of metal halide perovskite solar cells. *Adv. Energy Mater.* 5 (2015).
10. Sheng, R. et al. Photoluminescence characterisations of a dynamic aging process of organic-inorganic CH$_3$NH$_3$PbBr$_3$ perovskite. *Nanoscale* 8, 1926-1931 (2016).
11. Guarnera, S. et al. Improving the long-term stability of perovskite solar cells with a porous Al$_2$O$_3$ buffer layer. *J. Phys. Chem. Lett.* 6, 432-437 (2015).
12. Conings, B. et al. Intrinsic thermal instability of methylammonium lead trihalide perovskite. *Adv. Energy Mater.* 5, 1-8 (2015).
13. Habisreutinger, S. N. et al. Carbon nanotube/polymer composites as a highly stable hole collection layer in perovskite solar cells. *Nano lett* 14, 5561-5568 (2014).
14. Schmidt, L. C. et al. Nontemplate synthesis of CH$_3$NH$_3$PbBr$_3$ perovskite nanoparticles. *J. Am. Chem. Soc.* 136, 850-853 (2014).
15. Zhang, F. et al. Brightly luminescent and color-tunable colloidal CH$_3$NH$_3$PbX$_3$ (X=Br, I, Cl) quantum dots: potential alternatives for display technology. *ACS nano* 9, 4533-4542 (2015).
16. Zhu, F. et al. Shape evolution and single particle luminescence of organometal halide perovskite nanocrystals. *ACS Nano* 9, 2948-2959 (2015).
17. Di, D. et al. Size-dependent photon emission from organometal halide perovskite nanocrystals embedded in an organic matrix. *J. Phys. Chem. Lett.* 6, 446-450 (2015).
18. Longo, G., Pertegás, A., Martínez-Sarti, L., Sessolo, M. & Bolink, H. J. Highly luminescent perovskite-aluminum oxide composites. *J. Mater. Chem. C* 3, 11286-11289 (2015).
19. Erman, B. & Flory, P. Critical phenomena and transitions in swollen polymer networks and in linear macromolecules. *Macromolecules* 19, 2342-2353 (1986).
20. Li, M., Rouaud, O. & Poncelet, D. Microencapsulation by solvent evaporation: State of the art for process engineering approaches. *Int. J. Pharm.* 363, 26-39 (2008).
21. deQuilettes, D. W. et al. Impact of microstructure on local carrier lifetime in perovskite solar cells. *Science* 348, 683-686, (2015).
22. McKeen, L. W. *Permeability Properties of Plastics and Elastomers.* William Andrew, (2011).
23. Grassie, N. and Scott, G. *Polymer degradation and stabilisation.* Cambridge University Press, Cambridge, (1985). ISBN 0-521-24961-9.
24. Luo, Z., Xu, D. & Wu, S.-T. Emerging quantum-dots-enhanced LCDs. *J. Display Technol.* 10, 987-990 (2014).
25. Zhu, R., Luo, Z., Chen, H., Dong, Y. & Wu, S.-T. Realizing Rec. 2020 color gamut with quantum dot displays. *Optics express* 23, 23680-23693 (2015).
26. Chen, J. et al. Quantum Dots: Optimizing LCD Systems to Achieve Rec. 2020 Color Performance, *SID Symp. Dig. Tech. Pap.* 46, 173-175 (2015).
27. Steckel, J. S. et al. Quantum dots: The ultimate down-conversion material for LCD displays. *J. Soc. Inf. Display* 23, 294-305 (2015).
28. Tan, Z.-K. et al. Bright light-emitting diodes based on organometal halide perovskite. *Nature Nanotech.* 9, 687-692 (2014).
29. Cho, H. et al. Overcoming the electroluminescence efficiency limitations of perovskite light-emitting diodes. *Science* 350, 1222-1225 (2015).

30. Xing, G. et al. Low-temperature solution-processed wavelength-tunable perovskites for lasing. *Nature. Mater.* 13, 476-480 (2014).
31. Liu, W. H.; Breen, C.; Method of making quantum dots. International Patent Application Number: PCT/US2012/066140; Publication Number: WO 2013/078245 A1.
32. Shi, D. et al. Low trap-state density and long carrier diffusion in organolead trihalide perovskite single crystals. *Science* 347, 519-522 (2015).
33. Cho, H. et al. Overcoming the electroluminescence efficiency limitations of perovskite light-emitting diodes. *Science* 350, 1222-1225 (2015).

What is claimed is:

1. A method of making a perovskite-polymer composite, the method comprising,
   (i) contacting a perovskite precursor solution, comprising perovskite precursors, with a substrate, comprising a polymer matrix in the presence of a solvent; and
   (ii) creating a solvent-induced polymer swelling-deswelling process wherein the solvent penetrates the polymer matrix causing swelling of the polymer matrix and entry of the perovskite precursors into the polymer matrix; and
   (iii) removing the solvent from the polymer matrix leaving the perovskite precursors in the polymer matrix to react and to form perovskite nanocrystals;
   wherein the polymer matrix deswells forming a barrier layer around the perovskite nanocrystals to create the perovskite-polymer composite.

2. The method of claim 1, wherein the perovskite precursor solution comprises $PbX_2$ and $RNH_3X$ to yield $RNH_3PbX_3$ in solvent,
   wherein R is an unsubstituted or substituted $C_1$-$C_{20}$ alkyl or inorganic group, and
   wherein X is one or more different halide anions selected from the group consisting of fluoride ($F^-$), chloride ($Cl^-$), bromide ($Br^-$), and iodide ($I^-$).

3. The method of claim 1, wherein the perovskite precursor solution is an inorganic solution comprising $PbX_2$ and $CsX$ to yield $CsPbX_3$ in solvent,
   wherein R is an unsubstituted or substituted $C_1$-$C_{20}$ alkyl or inorganic group, and
   wherein X is one or more different halide anions selected from the group consisting of fluoride ($F^-$), chloride ($Cl^-$), bromide ($Br^-$), and iodide ($I^-$).

4. The method of claim 1, wherein the perovskite precursor solution is processed from a process selected from the group consisting of spin coating, dip coating, slot die coating, ink jet coating, spray coating and cotton swab painting.

5. The method of claim 1, wherein the solvent is selected from the group consisting of dimethylformamide (DMF), dimethyl sulfoxide (DMSO), r-butyrolactone (GBL), acetone, and acetonitrile.

6. The method of claim 1, wherein the solvent is removed by baking at 25-120 degrees Celsius.

7. The method of claim 1, wherein the polymer matrix comprises one or a combination selected from the group consisting of polystyrene (PS), polycarbonate (PC), cellulose acetate (CA), polyvinal chloride (PVC), poly (vinylidene fluoride), (PVDF), polyurea (PU), poly (methyl methacrylate) (PMMA), polyvinyl alcohol (PVA), and polynitriles.

* * * * *